United States Patent
Kim et al.

(10) Patent No.: US 12,501,583 B2
(45) Date of Patent: Dec. 16, 2025

(54) ELECTRONIC DEVICE COMPRISING HEAT EMISSION STRUCTURE

(71) Applicant: Samsung Electronics Co., Ltd., Suwon-si (KR)

(72) Inventors: Youngwook Kim, Suwon-si (KR); Sungwoo Lim, Suwon-si (KR); Chankyu Lim, Suwon-si (KR); Jonggeun Yoon, Suwon-si (KR); Jiwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 209 days.

(21) Appl. No.: 18/529,528

(22) Filed: Dec. 5, 2023

(65) Prior Publication Data

US 2024/0114662 A1 Apr. 4, 2024

Related U.S. Application Data

(63) Continuation of application No. PCT/KR2022/008066, filed on Jun. 8, 2022.

(30) Foreign Application Priority Data

Jun. 9, 2021 (KR) .................. 10-2021-0075002

(51) Int. Cl.
*H05K 7/20* (2006.01)
*C08K 7/06* (2006.01)
*C09K 5/14* (2006.01)

(52) U.S. Cl.
CPC ............ *H05K 7/2039* (2013.01); *C08K 7/06* (2013.01); *C09K 5/14* (2013.01); *C08K 2201/001* (2013.01)

(58) Field of Classification Search
CPC ............ H05K 9/0032; H05K 7/20445; H05K 7/2039; H05K 2201/10371; H05K 1/0203;
(Continued)

(56) References Cited

U.S. PATENT DOCUMENTS

| | | | |
|---|---|---|---|
| 6,744,640 B2 * | 6/2004 | Reis ................... | H05K 7/20445 257/E23.114 |
| 9,257,364 B2 * | 2/2016 | Ahuja ................. | H01L 21/4882 |

(Continued)

FOREIGN PATENT DOCUMENTS

| | | |
|---|---|---|
| JP | 2019-186310 A | 10/2019 |
| KR | 10-2016-0009914 A | 1/2016 |

(Continued)

OTHER PUBLICATIONS

International Search Report dated Sep. 13, 2022, issued in International Patent Application No. PCT/KR2022/008066.

*Primary Examiner* — Michael A Matey
(74) *Attorney, Agent, or Firm* — Jefferson IP Law, LLP

(57) ABSTRACT

An electronic device is provided. The electronic device includes a heat generation source including a heat dissipation surface dissipating heat, a support member disposed on a lateral side of the heat dissipation surface and surrounding at least a part of the heat generation source, a heat dissipation member facing the heat dissipation surface of the heat generation source and disposed so as to cover an area in which the support member is disposed, a thermal interface material disposed between the upper part of the heat dissipation surface of a heat generation surface and the lower surface of the heat generation source, and supported by the support member, and an adhesive member disposed in the area in which the thermal interface material is supported by the support member between the thermal interface material
(Continued)

and the heat dissipation member, and for coupling the thermal interface material and the heat dissipation member.

15 Claims, 21 Drawing Sheets

(58) Field of Classification Search
CPC .... H05K 7/205; H05K 9/0024; H05K 9/0026; H05K 1/0204; H05K 1/181; H05K 7/20481; H05K 9/0081; H05K 9/0084; H05K 2201/066; H05K 9/0007; H05K 7/20963; H05K 7/2049; H05K 9/0049; H05K 9/0035; H05K 9/003; H05K 9/0028; G06F 1/203; G06F 1/1658; G06F 1/20; G06F 2200/201; G06F 1/1656; H01L 23/552; H01L 21/4882; H01L 2924/3025; H04M 1/026; H04M 1/0277; F28D 15/0233; F28D 15/0275; H10N 30/88
See application file for complete search history.

(56) References Cited

U.S. PATENT DOCUMENTS

| | | | |
|---|---|---|---|
| 9,965,003 B2* | 5/2018 | Cheng | ................ H05K 7/20336 |
| 10,798,849 B2 | 10/2020 | Lee et al. | |
| 11,051,393 B2 | 6/2021 | Zhang et al. | |
| 11,304,337 B2* | 4/2022 | Lee | ......................... H05K 7/205 |
| 11,322,425 B2 | 5/2022 | Kumura | |
| 11,445,637 B2 | 9/2022 | Jung et al. | |
| 11,627,654 B2* | 4/2023 | Jung | ..................... H01L 23/3735 |
| | | | 361/720 |
| 2009/0213548 A1 | 8/2009 | Kempers et al. | |
| 2012/0061135 A1* | 3/2012 | Hill | ......................... H05K 9/009 |
| | | | 174/388 |
| 2018/0233428 A1* | 8/2018 | Kim | ..................... H01L 23/3737 |
| 2019/0198425 A1 | 6/2019 | Campbell et al. | |
| 2019/0364695 A1* | 11/2019 | Lee | ......................... H05K 9/0032 |
| 2020/0053919 A1* | 2/2020 | Lee | ......................... H05K 9/009 |
| 2020/0286809 A1 | 9/2020 | Gong et al. | |
| 2021/0013125 A1 | 1/2021 | North et al. | |
| 2023/0262940 A1* | 8/2023 | Ham | ................. H05K 7/20481 |
| | | | 361/708 |

FOREIGN PATENT DOCUMENTS

| | | |
|---|---|---|
| KR | 10-2017-0097541 A | 8/2017 |
| KR | 10-2018-0094831 A | 8/2018 |
| KR | 10-2020-0017115 A | 2/2020 |

* cited by examiner

ELECTRONIC DEVICE COMPRISING HEAT EMISSION STRUCTURE

CROSS-REFERENCE TO RELATED APPLICATION(S)

This application is a continuation application, claiming priority under § 365(c), of an International application No. PCT/KR2022/008066, filed on Jun. 8, 2022, which is based on and claims the benefit of a Korean patent application number 10-2021-0075002, filed on Jun. 9, 2021, in the Korean Intellectual Property Office, the disclosure of which is incorporated by reference herein in its entirety.

BACKGROUND

1. Field

The disclosure relates to an electronic device. More particularly, the disclosure relates to an electronic device including a heat dissipation structure.

2. Description of Related Art

With an increasing demand for performance in an electronic device such as personal computers (PCs), tablet computers, or mobile phones, heat generated from electronic components of the electronic devices, such as application processors (Aps), graphics processing units (GPUs), neural processing units (NPUs), modulator-demodulators (MODEMs), or power management integrated circuits (PMICs), increases. When heat generated by an electronic component is not effectively discharged to an outside of the electronic device, the temperature of the electronic component rises, resulting in thermal damage or a throttling operation to prevent damage, which deteriorates the performance of the electronic component.

An electronic device may include a heat sink to dissipate heat from an electronic component to the outside to keep the temperature of the electronic component low. The heat sink may generally include a metal having a high heat transfer coefficient, such as aluminum or copper.

A gap may occur in all or part of contact surfaces between the heat sink and the electronic component due to tolerances and alignment errors during assembly between the components, and surface roughness. The gap is filled with air having low thermal conductivity, increasing thermal resistance of the contact surfaces. Accordingly, a thermal interface material such as a thermal compound or a thermal pad may be used to fill the gap between the electronic component and the heat sink.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device having a heat dissipation structure in which detachment of a thermal interface material from a heat sink is prevented and close contact property between the heat sink and the thermal interface material is improved.

Additional aspects will be set forth in part in the description which follows and, in part, will be apparent from the description, or may be learned by practice of the presented embodiments.

In accordance with an aspect of the disclosure, an electronic device is provided. The electronic device includes a heating source including a heat dissipation surface configured to dissipate heat, a support member disposed on a lateral side of the heat dissipation surface and surrounding at least a portion of the heating source, a heat dissipation member facing the heat dissipation surface of the heating source and disposed to cover an area in which the support member is disposed, a thermal interface material disposed between the heat dissipation surface of the heating source and the bottom surface of the heat dissipation member, and supported by the support member, and an adhesive member disposed in the area in which the thermal interface material is supported by the support member between the thermal interface material and the heat dissipation member, the adhesive member bonds the thermal interface material and the heat dissipation member to each other. The adhesive member may press an area of the heat dissipation member in which the thermal interface material is supported by the support member, and the thermal interface material may be compressively deformed in the area in which the adhesive member is disposed to come into close contact with an area of the heat dissipation member facing the heat dissipation surface. In some embodiments, the thermal interface material may include a carbon-containing heat conductive fiber.

In some embodiments, the thermal interface material may have a lower compressive stiffness than that of the adhesive member. In some embodiments, when the heat dissipation member is bonded to a top portion of the thermal interface material, the thermal interface material may be compressively deformed in the area pressed by the adhesive member, and expansion may occur in the thermal interface material due to the compressive deformation, so that the thermal interface material may be brought into close contact with a bottom surface of the heat dissipation member.

In some embodiments, the support member may be a shield member configured to shield the top and side surfaces of the heating element from electromagnetic noise. The shield member may be an open-type shield can in which an area facing the heat dissipation surface is open and may be configured to shield the side surface of the heating element.

A shield film may be placed above the open area of the open-type shield can. In some embodiments, the electronic device may include an auxiliary thermal interface material placed between the heat dissipation surface and the bottom surface of the shield member.

In some embodiments, the support member may be disposed in a polygonal shape surrounding four side surfaces of the heat dissipation surface, the thermal interface material may have a polygonal shape corresponding to the shape of the support member, and the adhesive member may be disposed on at least one side of the polygonal shape of the thermal interface material supported by the support member. In another embodiment, the adhesive member may be disposed on sides of the polygonal shape of the thermal interface material except for one side of the polygonal shape. In still another embodiment, the adhesive member may be disposed on two facing sides of the polygonal shape of the thermal interface material. In still another embodiment, the adhesive member may be disposed on one side of the polygonal shape of the thermal interface material.

In accordance with another aspect of the disclosure, a heat dissipation device for an electronic device, which is a heat dissipation device for an electronic device including a heating source having a heat dissipation surface, is provided. The heat dissipation device includes a support member disposed on a lateral side of the heat dissipation surface and surrounding at least a portion of the heating source, a heat dissipation member facing the heat dissipation surface of the heating source and disposed to cover an area in which the support member is disposed, a thermal interface material disposed between the heat dissipation surface of the heating source and the bottom surface of the heat dissipation member, and supported by the support member, and an adhesive member disposed in the area in which the thermal interface material is supported by the support member between the thermal interface material and the heat dissipation member, the adhesive member bonds the thermal interface material and the heat dissipation member to each other. The adhesive member may press an area of the heat dissipation member in which the thermal interface material is supported by the support member, and the thermal interface material may be compressively deformed in the area in which the adhesive member is disposed to come into close contact with an area of the heat dissipation member facing the heat dissipation surface. In some embodiments, the thermal interface material may include a carbon-containing heat conductive fiber.

In some embodiments, the thermal interface material may have a lower compressive stiffness than that of the adhesive member. In some embodiments, when the heat dissipation member is bonded to a top portion of the thermal interface material, the thermal interface material may be compressively deformed in the area pressed by the adhesive member, and expansion may occur in the thermal interface material due to the compressive deformation, so that the thermal interface material may be brought into close contact with a bottom surface of the heat dissipation member.

In some embodiments, the support member may be a shield member configured to shield the top and side surfaces of the heating element from electromagnetic noise. In another embodiment, the shield member is an open-type shield can in which an area facing the heat dissipation surface is open and may be configured to shield the side surface of the heating element, and a shield film may be placed above the open area of the open-type shield can. In some embodiments, the heat dissipation device of the electronic device may include an auxiliary thermal interface material placed between the heat dissipation surface and the bottom surface of the shield member.

In some embodiments, the support member may be disposed in a polygonal shape surrounding four side surfaces of the heat dissipation surface, the thermal interface material may have a polygonal shape corresponding to the shape of the support member, and the adhesive member may be disposed on at least one side of the polygonal shape of the thermal interface material supported by the support member. In another embodiment, the adhesive member may be disposed on sides of the polygonal shape of the thermal interface material except for one side of the polygonal shape. In still another embodiment, the adhesive member may be disposed on two facing sides of the polygonal shape of the thermal interface material. In still another embodiment, the adhesive member may be disposed on one side of the polygonal shape of the thermal interface material.

According to various embodiments disclosed herein, in an electronic device, a support member supporting a thermal interface material is disposed on a lateral side of a heating surface of a heating source, and an adhesive member, which bonds the thermal interface material and the heat dissipation member to each other is disposed in an area supported by the support member. As a result, it is possible to provide a heat dissipation structure in which detachment of the thermal interface material from the heat dissipation member is prevented and close contact property between the heat sink and the thermal interface material is improved.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
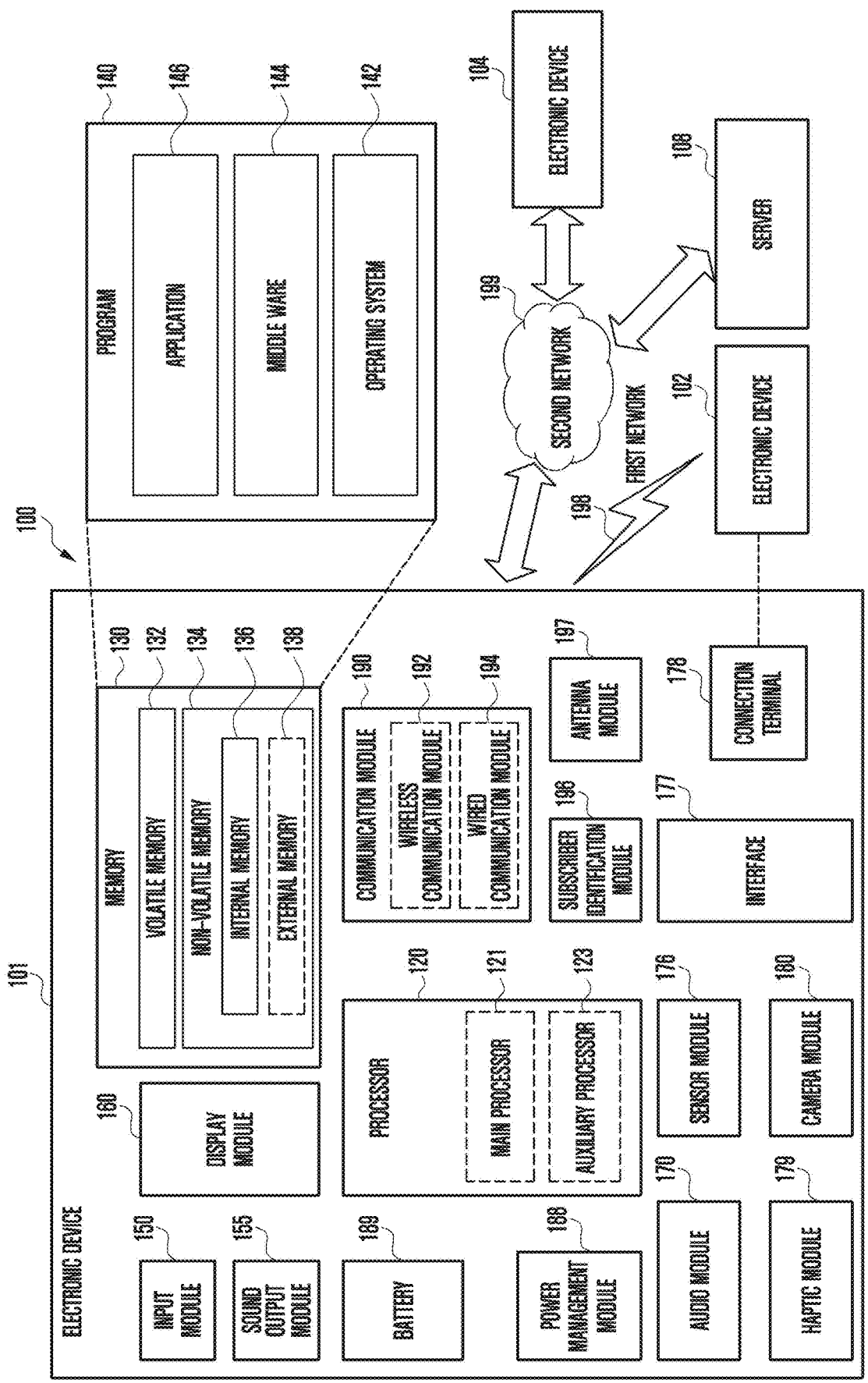
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, an electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to one embodiment, the electronic device 101 may communicate with the electronic device 104 via the server 108. According to another embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may be configured to execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134 (i.e., internal memory 136 or external memory 138). According to another embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may be configured to control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to one embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to another embodiment, the receiver may be implemented as separate from, or as part of the speaker.

The display device 160 may be configured to visually provide information to the outside (e.g., a user) of the electronic device 101. The display device 160 may include, for example, a display, a hologram device, or a projector and control circuitry to control a corresponding one of the display, hologram device, and projector. In an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to another embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to one embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to another embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). In an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to another embodiment, the haptic module 179 may include, for example, a motor, a piezoelectric element, or an electric stimulator.

The camera module 180 may capture a still image or moving images. In an embodiment, the camera module 180 may include one or more lenses, image sensors, image signal processors, or flashes.

The power management module 188 may manage power supplied to the electronic device 101. In one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may be configured to support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, a global navigation satellite system (GNSS) communication module, and the like) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, a computer network (e.g., LAN or wide area network (WAN), and the like). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to one embodiment, the antenna module 197 may include an antenna including a radiating element composed of a conductive material or a conductive pattern formed in or on a substrate (e.g., printed circuit board (PCB)). According to another embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to yet another embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to one embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. In another embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. In addition, the electronic device 101 may provide the outcome, with or without further processing of the outcome, as at least part of a reply to the request. To that end, a cloud computing, distributed computing, or client-server computing technology may be used, for example.

Figure 2:
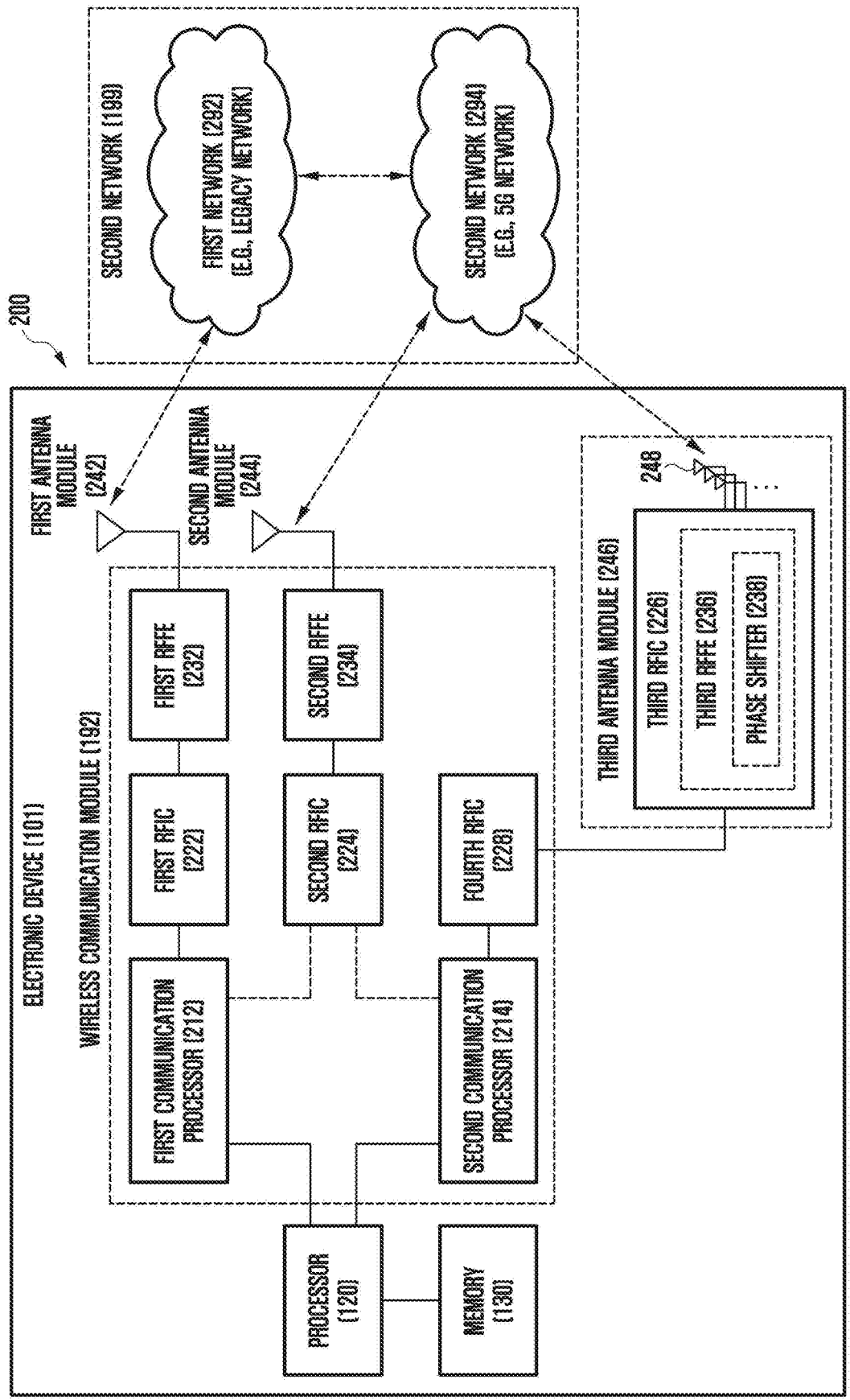
FIG. 2 is a block diagram of an electronic device for supporting legacy network communication and fifth-generation (5G) network communication according to an embodiment of the disclosure.

FIG. 2 is a block diagram 200 illustrating an example configuration of an electronic device 101 supporting legacy network communication and 5G network communication according to an embodiment of the disclosure.

Referring to FIG. 2, according to some embodiments, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may include the processor 120 and the memory 130. The network 199 may include a first network 292 and a second network 294. In an embodiment, the electronic device 101 may further include at least one component among the components illustrated in FIG. 1, and the network 199 may further include at least one other network. In another embodiment, the first communication processor 212, the second communication processor 214, the first RFIC 222, the second RFIC 224, the fourth RFIC 228, the first RFFE 232, and the second RFFE 234 may be at least a part of the wireless communication module 192. According to still another embodiment, the fourth RFIC 228 may be omitted, or may be included as a part of the third RFIC 226.

The first communication processor 212 may establish a communication channel of a band to be used for wireless communication with the first network 292, and may support legacy network communication via the established communication channel. According to one embodiment, the first network may be a legacy network including second generation (2G), third generation (3G), fourth generation (4G), long-term evolution (LTE) network, and the like. The second communication processor 214 may establish a communication channel corresponding to a designated band (e.g., approximately 6 GHz to 60 GHz) among bands to be used for wireless communication with the second network 294, and may support 5G network communication via the established communication channel. According to another embodiment, the second network 294 may be a 5G network (e.g., new radio (NR)) defined in 3GPP. In addition, according to an embodiment, the first communication processor 212 or the second communication processor 214 may establish a communication channel corresponding to another designated band (e.g., approximately 6 GHz or less) among bands to be used for wireless communication with the second network 294, and may support 5G network communication via the established communication channel. According to still another embodiment, the first communication processor 212 and the second communication processor 214 may be implemented in a single chip or a single package. The first communication processor 212 or the second communication processor 214 may be implemented in a single chip or a single package, together with the processor 120, the sub-processor 123, or the communication module 190.

In the case of transmission, the first RFIC 222 may convert a baseband signal generated by the first communication processor 212 into a radio frequency (RF) signal in the range of approximately 700 MHz to 3 GHz, which is used in the first network 292 (e.g., a legacy network). In the case of reception, an RF signal is obtained from the first network 292 (e.g., a legacy network) via an antenna (e.g., the first antenna module 242), and may be preprocessed via an RFFE (e.g., the first RFFE 232). The first RFIC 222 may convert the preprocessed RF signal into a baseband signal so that the baseband signal is processed by the first communication processor 212.

In the case of transmission, the second RFIC 224 may, for example, convert a baseband signal generated by the first communication processor 212 or the second communication processor 214 into an RF signal (hereinafter, a 5G Sub6 RF signal) in an Sub6 band (e.g., approximately 6 GHz or less) used in the second network 294 (e.g., a 5G network). In the case of reception, a 5G Sub6 RF signal may be obtained from the second network 294 (e.g., a 5G network) via an antenna (e.g., the second antenna module 244), and may be preprocessed by an RFFE (e.g., the second RFFE 234). The second RFIC 224 may, for example, convert the preprocessed 5G Sub6 RF signal into a baseband signal so that the signal may be processed by a corresponding communication processor among the first communication processor 212 or the second For example, the third RFIC 226 may convert a baseband signal generated by the second communication processor 214 into an RF signal (hereinafter, a 5G Above6 RF signal) of a 5G Above6 band (e.g., approximately 6 GHz to 60 GHz) to be used in the second network 294 (e.g., a 5G network). In the case of reception, a 5G Above6 RF signal is obtained from the second network 294 (e.g., a 5G network) via an antenna (e.g., the antenna 248), and may be preprocessed by the third RFFE 236. The third RFIC 226 may convert the preprocessed 5G Above6 RF signal into a baseband signal so that the signal is processed by the second communication processor 214. According to another embodiment, the third RFFE 236 may be implemented as a part of the third RFIC 226.

The electronic device 101 may include the fourth RFIC 228, separately from or, as a part of, the third RFIC 226. In this instance, the fourth RFIC 228 may convert a baseband signal produced by the second communication processor 214 into an RF signal (hereinafter, an IF signal) in an intermediate frequency band (e.g., approximately 9 GHz to 11 GHz), and may transfer the IF signal to the third RFIC 226. The third RFIC 226 may convert the IF signal into a 5G Above6 RF signal. In the case of reception, a 5G Above6 RF signal may be received from the second network 294 (e.g., a 5G network) via an antenna (e.g., the antenna 248), and may be converted into an IF signal by the third RFIC 226. The fourth RFIC 228 may convert the IF signal into a baseband signal so that the second communication processor 214 is capable of processing the baseband signal.

According to another embodiment, the first RFIC 222 and the second RFIC 224 may be implemented as at least a part of a single chip or a single package. According to an embodiment, the first RFFE 232 and the second RFFE 234 may be implemented as at least a part of a single chip or single package. According to an embodiment, at least one of the first antenna module 242 or the second antenna module 244 may be omitted or may be combined with another antenna module, to process RF signals of a plurality of corresponding bands.

According to still another embodiment, the third RFIC 226 and the antenna 248 may be disposed in the same substrate, and may form a third antenna module 246. For example, the wireless communication module 192 or the processor 120 may be disposed in a first substrate (e.g., a main PCB). In this instance, the third RFIC 226 is disposed in a part (e.g., a lower part) of a second substrate (e.g., a sub PCB) different from the first substrate, and the antenna 248 is disposed in another part (e.g., an upper part), so that the third antenna module 246 may be formed. By disposing the third RFIC 226 and the antenna 248 in the same substrate, the length of a transmission line therebetween may be reduced. In another example, this may reduce a loss (e.g., a diminution) of a high-frequency band signal (e.g., approximately 6 GHz to 60 GHz) used for 5G network communication, the loss being caused by a transmission line. Accordingly, the electronic device 101 may improve the quality or speed of communication with the second network 294 (e.g., a 5G network).

The antenna 248 may be configured to implemented as an antenna array including a plurality of antenna elements which may be used for beamforming. In this instance, the third RFIC 226, for example, may include a plurality of phase shifters 238 corresponding to a plurality of antenna elements, as a part of the third RFFE 236. In the case of transmission, each of the plurality of phase shifters 238 may shift the phase of a 5G Above6RF signal to be transmitted to the outside of the electronic device 101 (e.g., a base station of a 5G network) via a corresponding antenna element. In the case of reception, each of the plurality of phase shifters 238 may shift the phase of a 5G Above6 RF signal received from the outside via a corresponding antenna element into the same or substantially the same phase. This may enable transmission or reception via beamforming between the electronic device 101 and the outside.

The second network 294 (e.g., a 5G network) may, for example, operate independently (e.g., Standalone (SA)) from the first network 292 (e.g., a legacy network), or may operate by being connected thereto (e.g., Non-Standalone (NSA)). For example, in the 5G network, only an access network (e.g., 5G radio access network (RAN) or next generation RAN (NG RAN)) may exist, and a core network (e.g., next generation core (NGC)) may not exist. In this instance, the electronic device 101 may access the access network of the 5G network, and may access an external network (e.g., the Internet) under the control of the core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in the memory 130, and may be accessed by another component (e.g., the processor 120, the first communication processor 212, or the second communication processor 214).

Figure 3A:
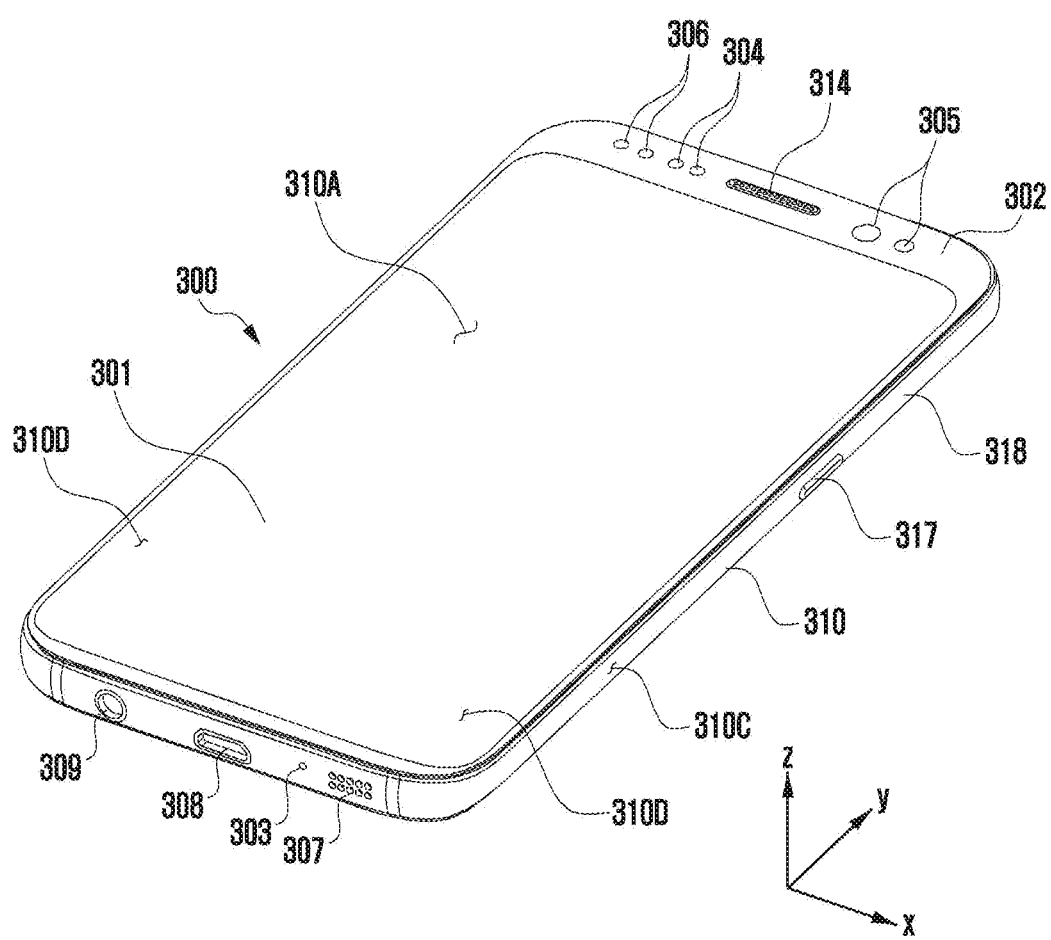
FIG. 3A is a perspective view of an electronic device according to an embodiment of the disclosure.

FIG. 3A is a front perspective view of an electronic device 300 according to an embodiment of the disclosure.

Figure 3B:
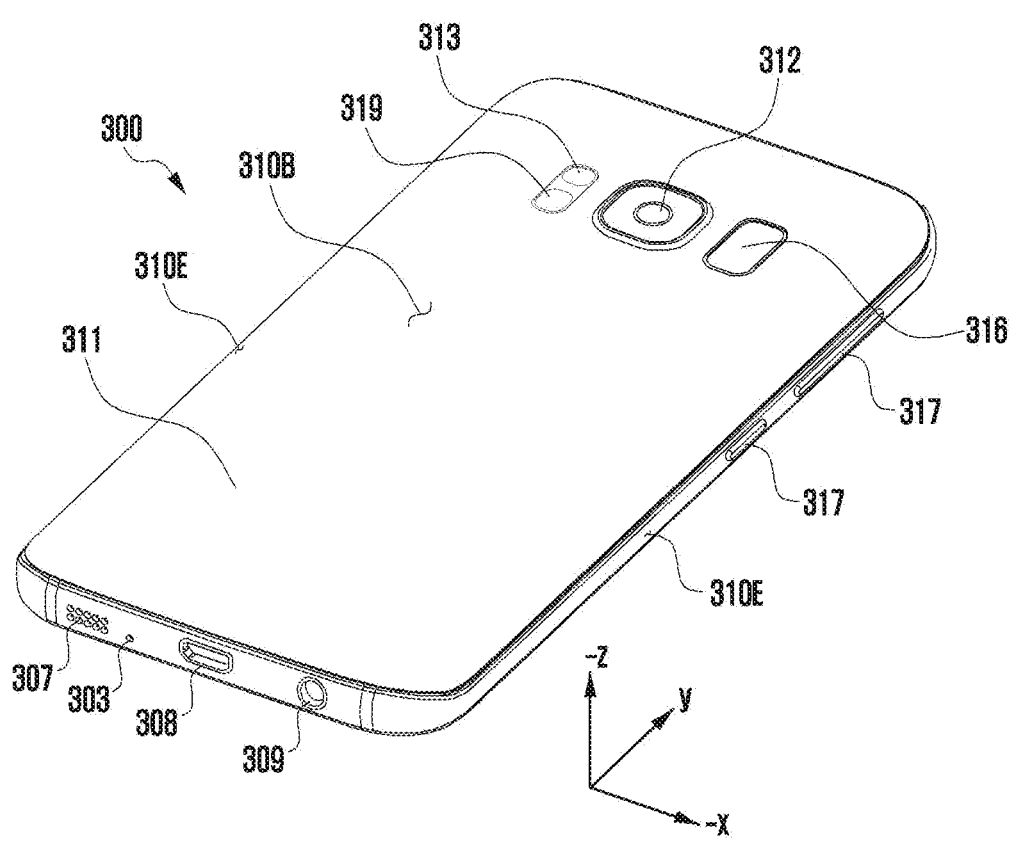
FIG. 3B is a rear perspective view of an electronic device according to an embodiment of the disclosure.

FIG. 3B is a rear perspective view of an electronic device 300 according to an embodiment of the disclosure.

Referring to FIGS. 3A and 3B, an electronic device 300 (e.g., an electronic device 101 in FIG. 1) according to various embodiments may include a housing 310 including a first surface (or a front surface) 310A, a second surface (or a rear surface) 310B, and a side surface 310C surrounding the space (or the internal space) between the first surface 310A and the second surface 310B. In one embodiment (not illustrated), the housing may refer to a structure forming a portion of the first surface 310A, the second surface 310B, and the side surface 310C. According to another embodiment, at least a portion of the first surface 310A may be defined by a substantially transparent front surface plate 302 (e.g., a glass plate or a polymer plate including various coating layers). The second surface 310B may be defined by a substantially opaque rear surface plate 311. The rear surface plate 311 may be made of, for example, coated or colored glass, ceramic, polymer, metal (e.g., aluminum, stainless steel (STS), or magnesium), or a combination of two or more of the above-mentioned materials. The side surface 310C may be defined by a side surface bezel structure (or a "side surface member") 318 coupled to the front surface plate 302 and the rear surface plate 311 and including metal and/or polymer. In various embodiments, the rear surface plate 311 and the side surface bezel structure 318 may be integrally configured and may include the same material (e.g., a metal material such as aluminum).

The front surface plate 302 may include, at the long opposite side edges thereof, two first areas 310D, which are bent from the first surface 310A toward the rear surface plate 311 and extend seamlessly. In the illustrated embodiment (see FIG. 3B), the rear surface plate 311 may include, at the long opposite side edges thereof, two second areas 310E, which are bent from the second surface 310B toward the front surface plate 302 and extend seamlessly. In various embodiments, the front surface plate 302 (or the rear surface plate 311) may include only one of the first areas 310D (or the second areas 310E). In one embodiment, the front surface plate 302 (or the rear surface plate 311) may not include a portion of the first areas 310D (or the second areas 310E). In another embodiment, when viewed from a lateral side of the electronic device 300, the side surface bezel structure 318 may have a first thickness (or width) on the side where the first areas 310D or the second areas 310E are not included, and may have a second thickness, which is smaller than the first thickness, on the side where the first areas 310D or the second areas 310E are included.

In an embodiment, the electronic device 300 may include at least one of a display 301, audio modules 303, 307, and 314, sensor modules 304, 316, and 319, camera modules 305, 312, and 313, key input devices 317, light-emitting elements 306, and connector holes 308 and 309. In other embodiments, at least one of the components (e.g., the key input devices 317 or the light-emitting elements 306) may be omitted from the electronic device 300, or other components may be additionally included in the electronic device 101.

The display 301 may be visually exposed through a substantial portion of, for example, the front surface plate 302. In some embodiments, at least a portion of the display 301 may be visually exposed through the front surface plate 302 defining the first surface 310A and the first areas 310D of the side surface 310C. The edges of the display 301 may be configured to be substantially the same as the shape of the periphery of the front surface plate 302 adjacent thereto. In another embodiment (not illustrated), the distance between the periphery of the display 301 and the periphery of the front surface plate 302 may be substantially constant in order to enlarge the exposed area of the display 301.

In yet another embodiment (not illustrated), recesses or openings may be provided in some portions of the screen display area of the display 301, and one or more of the audio module 314, the sensor module 304, the camera module 305, and the light-emitting elements 306 may be aligned with the recesses or the openings. In still another embodiment (not illustrated), the rear surface of the screen display area of the display 301 may include at least one of the audio modules 314, the sensor module 304, the camera module 305, the fingerprint sensor 316, and the light-emitting elements 306. In an embodiment (not illustrated), the display 301 may be coupled to or disposed adjacent to a touch-sensitive circuit, a pressure sensor capable of measuring a touch intensity (pressure), and/or a digitizer configured to detect an electromagnetic field-type stylus pen. In various embodiments, at least some of the sensor modules 304 and 319 and/or at least some of the key input devices 317 may be disposed in the first areas 310D and/or the second areas 310E.

The audio modules 303, 307, and 314 may include a microphone hole 303 and speaker holes 307 and 314. The microphone hole 303 may include a microphone disposed therein to acquire external sound, and in some embodiments, a plurality of microphones may be disposed therein to be able to detect the direction of sound. The speaker holes 307 and 314 may, for example, include an external speaker hole 307 and a communication receiver hole 314. In some embodiments, the speaker holes 307 and 314 and the microphone hole 303 may be implemented as a single hole, or a speaker (e.g., a piezo speaker) may be included without the speaker holes 307 and 314.

In an embodiment, the sensor modules 304, 316, and 319 may generate electrical signals or data values corresponding to the internal operating state or the external environmental state of the electronic device 300. The sensor modules 304, 316, and 319 may include, for example, a first sensor module 304 (e.g., a proximity sensor) and/or a second sensor module (not illustrated) (e.g., a fingerprint sensor) disposed on the first surface 310A of the housing 310, and/or a third sensor module 319 (e.g., an HRM sensor) and/or a fourth sensor module 316 (e.g., a fingerprint sensor) disposed on the second surface 310B of the housing 310. The fingerprint sensor may be disposed not only on the first surface 310A (e.g., the display 301) of the housing 310, but also on the second surface 310B. The electronic device 300 may be configured to further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304.

The camera modules 305, 312, and 313 may include a first camera device 305 disposed on the first surface 310A of the electronic device 300, and a second camera device 312 and/or a flash 313 disposed on the second surface 310B of the electronic device of the network environment 100. The camera modules 305 and 312 may include one or more lenses, an image sensor, and/or an image signal processor. The flash 313 may include, for example, a light-emitting diode or a xenon lamp. In various embodiments, two or more lenses (e.g., an infrared camera, a wide-angle lens, and a telephoto lens), and image sensors may be disposed on one surface of the electronic device 300.

The key input devices 317 may be disposed on the side surface 310C of the housing 310. In one embodiment, the electronic device 300 may not include some or all of the key input devices 317, and a key input device 317 not included in the electronic device 300 may be implemented in the form of a soft key on the display 301. In another embodiment, the key input devices 317 may include a sensor module 316 disposed on the second surface 310B of the housing 310.

The light-emitting elements 306 may be disposed on the first surface 310A of the housing 310. The light-emitting elements 306 may provide, for example, the state information of the electronic device 300 in an optical form. In an embodiment, the light-emitting elements 306 may provide a light source that is operationally interlocked with the camera module 305. The light-emitting elements 306 may include, for example, a light-emitting diode (LED), an infrared (IR) LED, and a xenon lamp.

The connector holes 308 and 309 may, for example, include a first connector hole 308 capable of accommodating a connector (e.g., a USB connector) configured to transmit/receive power and/or data to/from an external electronic device, and a second connector hole (e.g., an earphone jack) 209 capable of accommodating a connector configured to transmit/receive an audio signal to/from an external electronic device.

Figure 3C:
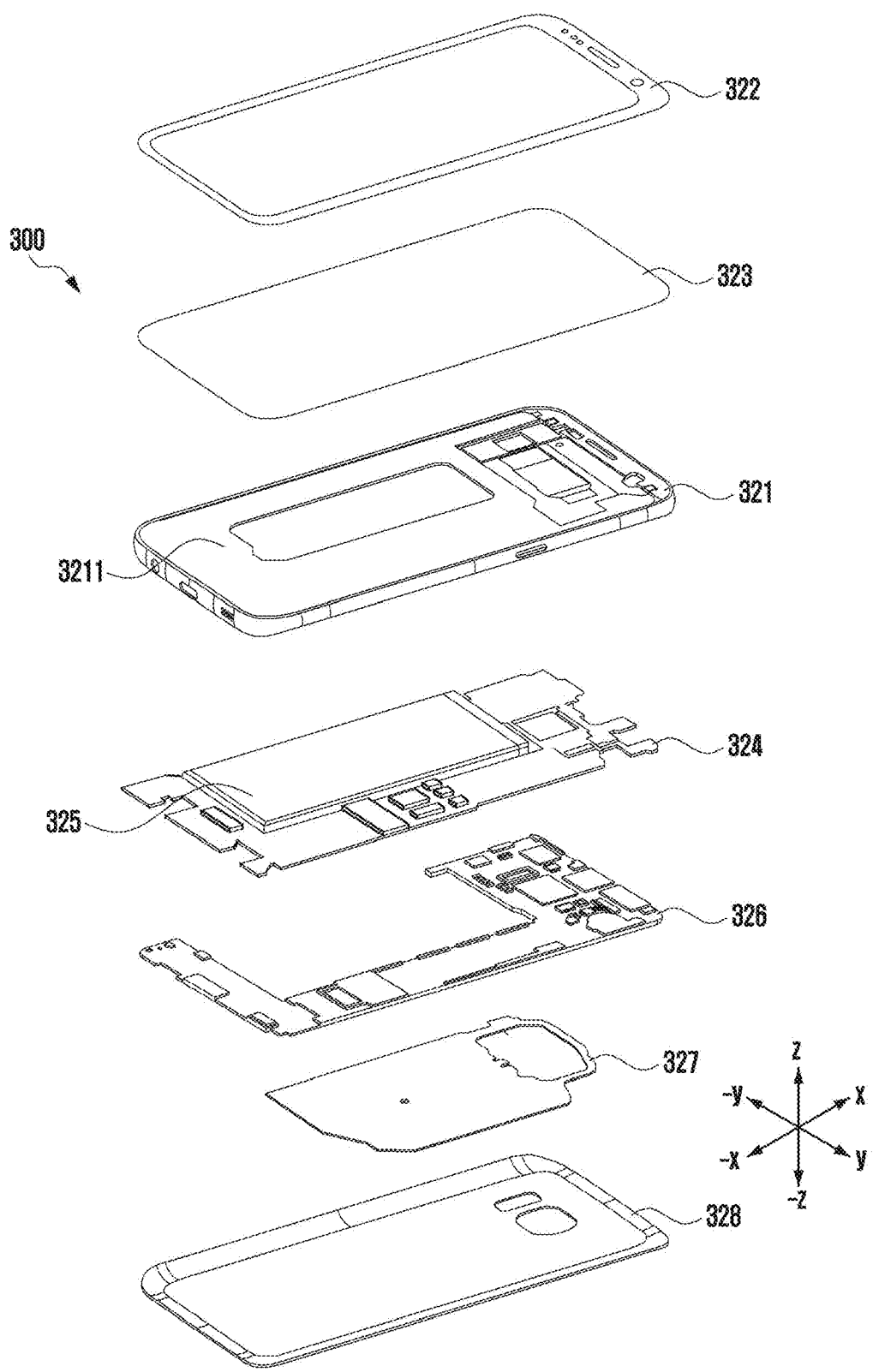
FIG. 3C is an exploded perspective view of an electronic device according to an embodiment of the disclosure.

FIG. 3C is an exploded perspective view of an electronic device 300 according to an embodiment of the disclosure.

Referring to FIG. 3C, an electronic device 300 may include a side surface bezel structure 321, a first frame 3211 (e.g., a bracket), a front surface plate 322, a display 323, a printed circuit board 324, a battery 325, a second frame 326 (e.g., a rear case), an antenna 327, and a rear surface plate 328. In various embodiments, at least one of the components (e.g., the first frame 3211 or the second frame 326) may be omitted from the electronic device 300, or other components may be additionally included in the electronic device 300. At least one of the components of the electronic device 300 may be the same as or similar to at least one of the components of the electronic device 300 of FIG. 3A or FIG. 3B, and a redundant description thereof will be omitted below.

The first frame 3211 may be disposed inside the electronic device 300 to be connected to the side surface bezel structure 321, or may be configured integrally with the side surface bezel structure 321. In another embodiment, the first frame 3211 may be made of, for example, a metal material and/or a non-metal (e.g., polymer) material. The first frame 3211 may have one surface to which the display 323 is coupled, and the other surface to which the printed circuit board 324 is coupled. A processor (e.g., the processor 120 in FIG. 1), a memory (e.g., the memory 130 in FIG. 1), and/or an interface (e.g., the interface 177 in FIG. 1) may be mounted on the printed circuit board 324. The processor may include one or more of a central processing unit, an application processor, a graphics processing unit, an image signal processor, a sensor hub processor, or a communication processor.

The memory may include, for example, a volatile memory (e.g., the volatile memory 132 in FIG. 1) or a nonvolatile memory (e.g., the nonvolatile memory 134 in FIG. 1).

The interface may include, for example, a high-definition multimedia interface (HDMI), a universal serial bus (USB) interface, an SD card interface, and/or an audio interface. The interface may electrically or physically connect, for example, the electronic device 300 to an external electronic device and may include a USB connector, an SD card/multimedia card (MMC) connector, or an audio connector.

The battery 325 is a device for supplying power to at least one component of the electronic device 300, and may include a non-rechargeable primary battery, a rechargeable secondary battery, or a fuel cell. At least a portion of the battery 325 may be disposed on substantially the same plane as the printed circuit board 324. The battery 325 may be integrally disposed inside the electronic device 300, or may be detachably disposed on the electronic device 300.

The antenna 327 may be disposed between the rear surface plate 328 and the battery 325. The antenna 327 may include, for example, a near-field communication (NFC) antenna, a wireless charging antenna, and/or a magnetic secure transmission (MST) antenna. In an example, the antenna 327 may execute short-range communication with an external device or may transmit/receive power required for charging to/from the external device in a wireless manner. In an embodiment, the antenna structure may be configured with a portion of the side surface bezel structure 321 and/or the first frame 3211 or a combination thereof.

Figure 4:
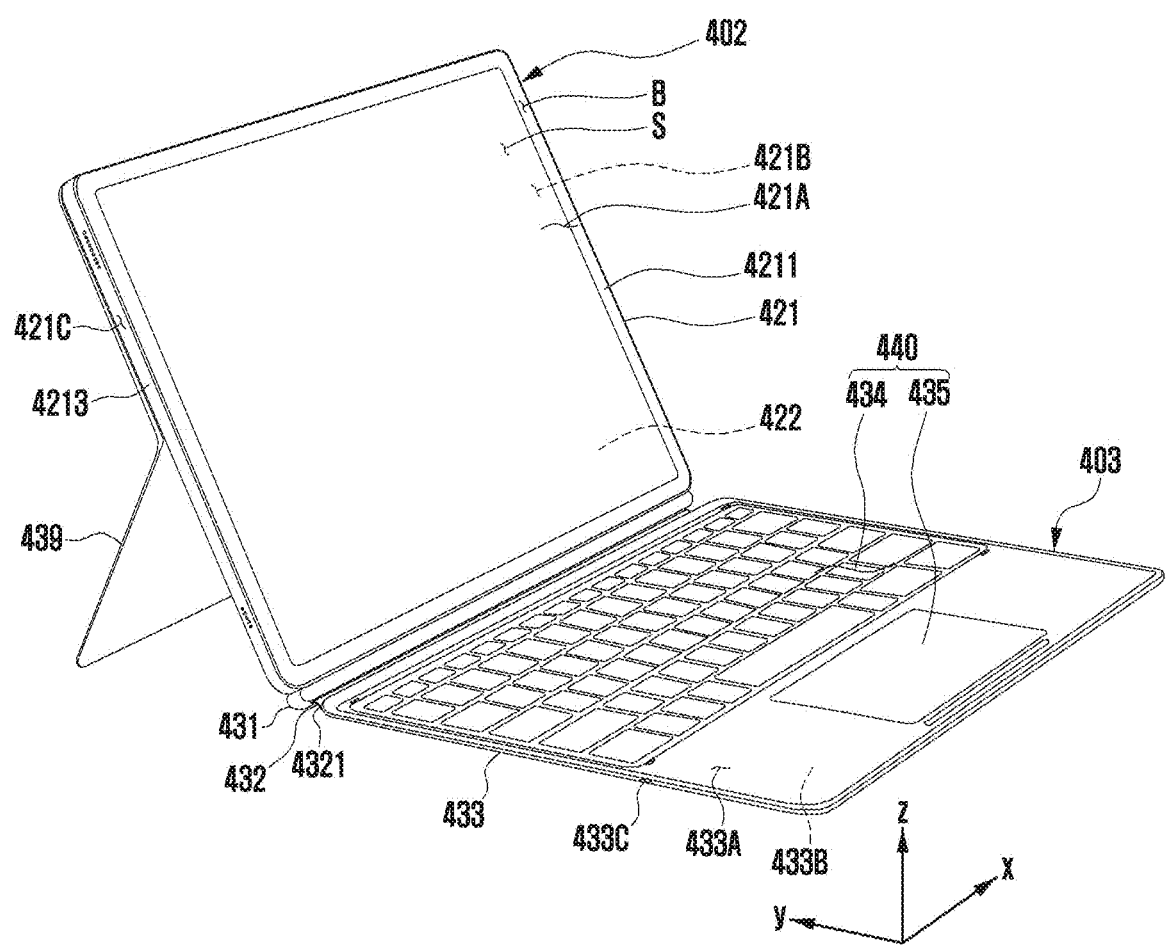
FIG. 4 is a perspective view illustrating an electronic device and a cover device of the electronic device according to an embodiment of the disclosure.

FIG. 4 is a perspective view illustrating an electronic device 402 and a cover device 403 of the electronic device 402 according to an embodiment of the disclosure.

An electronic device 402 may be, for example, an electronic device 101 of FIG. 1 or may include at least one of the components included in the electronic device 101 of FIG. 1.

Referring to FIG. 4, in some embodiments, an electronic device 402 may have a form factor of a laptop computer (or a portable personal computer such as a notebook computer). In another embodiment, the electronic device 402 may have the same form factor as a portable tablet computer, and when the cover device 403 is coupled thereto, the electronic device 402 may be turned into a form of a portable personal computer so that the usability of the electronic device 402 may be expanded.

In one embodiment, the electronic device 402 may include a housing 421 that provides a front surface 421A of the electronic device 402, a rear surface 421B of the electronic device 402, and a side surface 421c of the electronic device 402 surrounding the space between the front surface 421A and the rear surface 421B. In some embodiments, the housing 421 may refer to a structure that provides at least some of the front surface 421A of the electronic device 402, the rear surface 421B of the electronic device 402, and the side surface 421C of the electronic device 402.

According to another embodiment, the housing 421 may include a front surface plate 4211, a rear surface plate (not illustrated), and/or a side surface bezel structure (or a side surface member) 4213. At least a portion of the front surface 421A of the electronic device 402 may be defined by a substantially transparent front surface plate 4211. The rear surface plate may, for example, be positioned on the opposite side to the front surface plate 4211. At least a portion of the rear surface 421B of the electronic device 402 may be defined by a substantially opaque rear surface plate. The side surface bezel structure 4213 may surround at least a portion of the space between the front surface plate 4211 and the rear surface plate. In addition, at least a portion of the side surface 421C of the electronic device 402 may be defined by the side surface bezel structure 4213. In some embodiments, the rear surface plate and the side surface bezel structure 4213 may be integrally configured and made of the same material (e.g., a metal material such as aluminum or a polymer material).

The display 422 (e.g., a display module 4160 in FIG. 1) may be located in the inner space of the housing 421 while at least partially overlapping the front surface plate 4211. The front surface plate 4211 may protect the display 422 from the outside. Light output from the display 422 may proceed to the outside through the front surface plate 4211. The screen S of the electronic device 402 may refer to an area capable of displaying an image in the device including the display 422 and the front surface plate 4211, and may include, for example, a display area (or an active area) of the display 422 and a partial area of the front surface plate 4211 overlapping the display area. In various embodiments, the front surface plate 4211 may be configured integrally with the display 422 as a component included in the display 422. A peripheral area surrounding the screen S of the front surface 421A of the electronic device 402 may be substantially opaque and may include a screen bezel B. In an example, an opaque material may be disposed on the rear surface of the area corresponding to the screen bezel B of the front surface plate 4211. The screen S is not limited to the illustrated example and may be further expanded like, for example, a "bezel-less" display or a "full screen" display. In other embodiments, the display 422 may include a touch sensor (or a touch detection circuit) configured to detect a touch, or a pressure sensor configured to measure the force generated by the touch. In some embodiments, the display 422 may include an electromagnetic induction panel (e.g., a digitizer) configured to detect a magnetic pen input device (e.g., a digitizer) or may be combined with an electromagnetic induction panel. According to another embodiment, the electronic device 402 may include a detachable pen input device (e.g., an electronic pen, a digital pen, or a stylus pen).

In an embodiment, the electronic device 402 may include a display 422, an input module, a sound output module, a first camera module, a second camera module, a sensor module, or at least one connection terminal. In some embodiments, at least one of the components may be omitted from the electronic device 402 or other components may be additionally included in the electronic device of the network environment 100. The positions or the number of components included in the electronic device 402 may vary without being limited to the illustrated example.

According to still another embodiment, a cover 433 may include a front surface 433A, a rear surface 433B located on the opposite side to the front surface 433A, and a side surface 433c surrounding at least a portion of the space between the front surface 433A and the rear surface 433B. In an example, the side surface 433C may extend from one side 4321 to the other side 4322 of a folding portion 432. When the cover device 403 is in a closed state, the cover 433 may be located so as not to approach the front surface 421A of the electronic device 402 any further while facing the front surface 412, and the front surface 421A of the electronic device 402 and the front surface 433A of the cover 433 may not be substantially exposed to the outside. When the cover device 403 is in the closed state, the side surface 433C of the cover device 403 may be aligned with a portion of the side surface 421C of the electronic device 402. When the cover device 403 is not in the closed state (e.g., when the cover device 403 is in an open state), the front surface 421A of the electronic device 402 and the front surface 433A of the cover 433 may be exposed to the outside. The open state of the cover device 403 may vary depending on the open angle of the cover 433. In an example, there may be an open state in which the front surface 421A of the electronic device 402 and the front surface 433A of the cover 433 form an acute angle, about 180 degrees, or an obtuse angle. In another example, there may be an open state in which the cover 433 is located so as not to approach the rear surface 421B of the electronic device 402 any further while facing the rear surface 421B.

In an embodiment, the cover device 403 may be electrically connected to the electronic device 402. The cover device 403 may include, for example, the external electronic device 4102 of FIG. 1. In another embodiment, the cover device 403 may include an electronic component, such as a display module, an input module, a sound output module, a camera module, a sensor module, or at least one connection terminal. In some embodiments, the cover device 403 may include at least one of the components included in the electronic device 101 of FIG. 1. The electronic components included in the cover device 403 may be electrically connected to the electronic device 402 via a connection portion 431. For example, the cover device 403 may include a keyboard 434 or a touch pad 435 located on the cover 433. Various other input modules 440 may be provided, and may include, for example, one or more key input devices (e.g., various function keys such as a power button). In yet another embodiment, an input module 440 may occupy a portion of the front surface 433A of the cover 433. The electronic device 402 may execute various operations (or functions) in response to a user input generated via the keyboard 434 or the touch pad 435.

According to still another embodiment, the connection portion 431 of the cover device 403 may include an electrical path that electrically connects the electronic components (e.g., the key board and the touch pad 435) included in the cover device 403 to the electronic device 402. The electrical path may include, for example, a flexible printed circuit board (not illustrated) located inside the cover device 403. In an embodiment, the electrical path may extend from the connection portion 431 to the cover 433 through the folding portion 432, and a plurality of terminals 436 may be electrically connected to the input module 440 located on the cover 433 via the electrical path.

The cover device 403 may include a support cover 439 attachable to the rear surface 421B of the electronic device 402. The support cover 439 may, for example, be attached to the rear surface 421B of the electronic device 402 by using an attractive force between a magnetic element included in the support cover 439 and a magnetic element included in the electronic device 402. The support cover 439 may be implemented as a foldable type, and may be used to maintain the electronic device 402 at various angles with respect to, for example, the cover 433.

FIG. 4 is a perspective view illustrating an electronic device 402 according to another embodiment and a cover device 403 of the electronic device 402.

An electronic device 402 of may be the electronic device 101 of FIG. 1 or may include at least one of the components included in the electronic device 101 of FIG. 1.

Referring to FIG. 4, in some embodiments, the electronic device 402 may have a form factor of a laptop computer (or a portable personal computer such as a notebook computer). In an embodiment, the electronic device 402 may have a form factor similar to that of a portable tablet computer or a detachable tablet computer. The cover device 403 in the detachable tablet computer may be detachably coupled to a portable tablet computer, and when the cover device 403 is coupled, the electronic device 402 has a form factor similar to that of a portable personal computer, so that the usability of the electronic device 402 may be expanded.

In one embodiment, the electronic device 402 may include a housing 421 that provides a front surface 421A of the electronic device 402, a rear surface 421B of the electronic device 402, and a side surface 421*c* of the electronic device 402 surrounding the space between the front surface 421A and the rear surface 421B. In some embodiments, the housing 421 may refer to a structure that provides at least some of the front surface 421A of the electronic device 402, the rear surface 421B of the electronic device 402, and the side surface 421C of the electronic device 402.

According to another embodiment, the housing 421 may include a front surface plate 4211, a rear surface plate (not illustrated), and/or a side surface bezel structure (or a side surface member) 4213. At least a portion of the front surface 421A of the electronic device 402 may be defined by a substantially transparent front surface plate 4211. In still another embodiment, the rear surface plate may be positioned on the opposite side to the front surface plate 4211. At least a portion of the rear surface 421B of the electronic device 402 may be defined by a substantially opaque rear surface plate. The side surface bezel structure 4213 may surround at least a portion of the space between the front surface plate 4211 and the rear surface plate. At least a portion of the side surface 421C of the electronic device 402 may be defined by the side surface bezel structure 4213. In other embodiments, the rear surface plate and the side surface bezel structure 4213 may be integrally configured and made of the same material (e.g., a metal material such as aluminum or a polymer material).

The display 422 (e.g., the display module 4160 in FIG. 1) may, for example, be located in the inner space of the housing 421 while at least partially overlapping the front surface plate 4211. The front surface plate 4211 may protect the display 422 from the outside. Light output from the display 422 may proceed to the outside through the front surface plate 4211. The screen S of the electronic device 402 may refer to an area capable of displaying an image in the device including the display 422 and the front surface plate 4211, and may include, for example, a display area (or an active area) of the display 422 and a partial area of the front surface plate 4211 overlapping the display area. In an embodiment, the front surface plate 4211 may be configured integrally with the display 422 as a component included in the display 422. A peripheral area surrounding the screen S of the front surface 421A of the electronic device 402 may be substantially opaque and may include a screen bezel B. For example, an opaque material may be disposed on the rear surface of the area corresponding to the screen bezel B of the front surface plate 4211. The screen S is not limited to the illustrated example and may be further expanded like, for example, a "bezel-less" display or a "full screen" display. In another embodiment, the display 422 may include a touch sensor (or a touch detection circuit) configured to detect a touch, or a pressure sensor configured to measure the force generated by the touch. In some embodiments, the display 422 may include an electromagnetic induction panel (e.g., a digitizer) configured to detect a magnetic pen input device (e.g., a digitizer) or may be combined with an electromagnetic induction panel. According to still another embodiment, the electronic device 402 may include a detachable pen input device (e.g., an electronic pen, a digital pen, or a stylus pen).

In an embodiment, the electronic device 402 may include a display 422, an input module, a sound output module, a first camera module, a second camera module, a sensor module, or at least one connection terminal. In other embodiments, at least one of the components may be omitted from the electronic device 402 or other components may be additionally included in the electronic device of the network environment 100. The positions or the number of components included in the electronic device 402 may vary without being limited to the illustrated example.

In an embodiment, a cover 433 may include a front surface 433A, a rear surface 433B located on the opposite side to the front surface 433A, and a side surface 433*c* surrounding at least a portion of the space between the front surface 433A and the rear surface 433B. In an example, the side surface 433C may extend from one side 4321 to the other side 4322 of a folding portion 432. When the cover device 403 is in a closed state, the cover 433 may be located so as not to approach the front surface 421A of the electronic device 402 any further while facing the front surface 412, and the front surface 421A of the electronic device 402 and the front surface 433A of the cover 433 may not be substantially exposed to the outside. When the cover device 403 is in the closed state, the side surface 433C of the cover device 403 may be aligned with a portion of the side surface 421C of the electronic device 402. When the cover device 403 is not in the closed state (e.g., when the cover device 403 is in an open state), the front surface 421A of the electronic device 402 and the front surface 433A of the cover 433 may be exposed to the outside. The open state of the cover device 403 may vary depending on the open angle of the cover 433. In another example, there may be an open state in which the front surface 421A of the electronic device 402 and the front surface 433A of the cover 433 form an acute angle, about 180 degrees, or an obtuse angle. As another example, there may be an open state in which the cover 433 is located so as not to approach the rear surface 421B of the electronic device 402 any further while facing the rear surface 421B.

The cover device 403 may be electrically connected to the electronic device 402. The cover device 403 may include, for example, the external electronic device 4102 of FIG. 1. In an embodiment, the cover device 403 may include an electronic component, such as a display module, an input module, a sound output module, a camera module, a sensor module, or at least one connection terminal. In other embodiments, the cover device 403 may include at least one of the components included in the electronic device 101 of FIG. 1. The electronic components included in the cover device 403 may be electrically connected to the electronic device 402 via a connection portion 431. For example, the cover device 403 may include a keyboard 434 or a touch pad 435 located on the cover 433. Various other input modules 440 may be provided, and may include, for example, one or more key input devices (e.g., various function keys such as a power button). An input module 440 may occupy a portion of the front surface 433A of the cover 433. The electronic device 402 may execute various operations (or functions) in response to a user input generated via the keyboard 4354 or the touch pad 435.

The connection portion 431 of the cover device 403 may include an electrical path that electrically connects the electronic components (e.g., the key board and the touch pad 435) included in the cover device 403 to the electronic device 402. The electrical path may include, for example, a flexible printed circuit board (not illustrated) located inside the cover device 403. In an embodiment, the electrical path may extend from the connection portion 431 to the cover 433 through the folding portion 432, and a plurality of terminals 436 may be electrically connected to the input module 440 located on the cover 433 via the electrical path.

In an embodiment, the cover device 403 may include a support cover 439 attachable to the rear surface 421B of the electronic device 402 The support cover 439 may, for example, be attached to the rear surface 421B of the electronic device 402 by using an attractive force between a magnetic element included in the support cover 439 and a magnetic element included in the electronic device 402. The support cover 439 may be implemented as a foldable type, and may be used to maintain the electronic device 402 at various angles with respect to, for example, the cover 433.

Figure 5A:
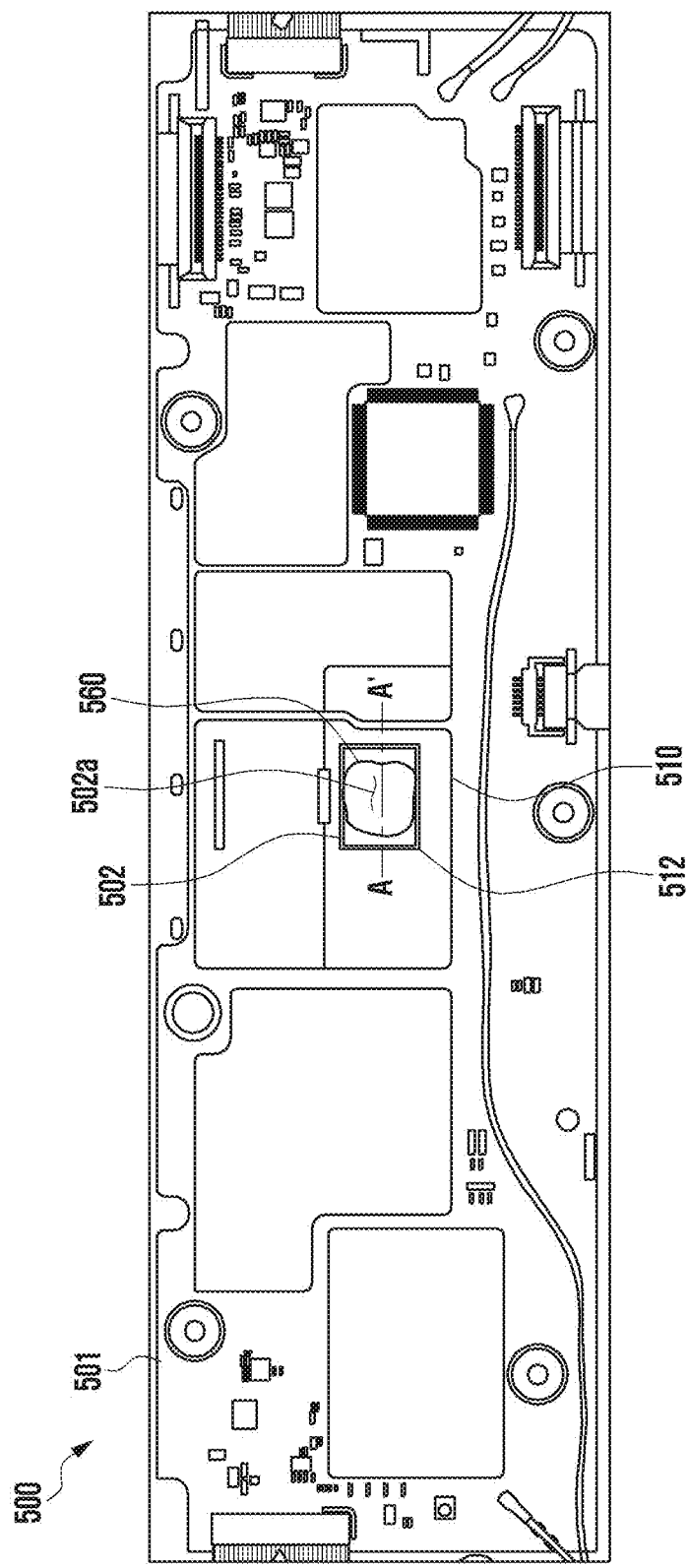
FIG. 5A is a plan view illustrating a substrate of an electronic device according to an embodiment of the disclosure.

FIG. 5A is a plan view illustrating a substrate unit 500 of an electronic device according to an embodiment of the disclosure.

Figure 5B:
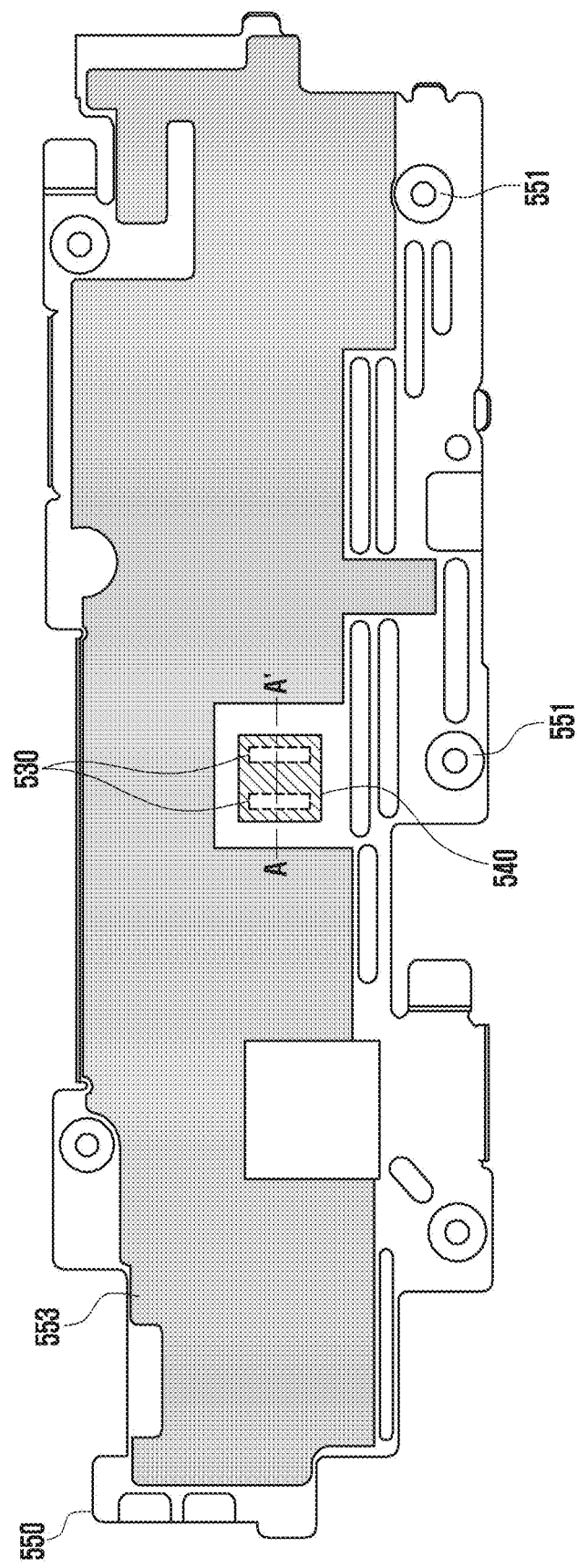
FIG. 5B is a plan view illustrating a heat dissipation member of an electronic device according to an embodiment of the disclosure.

FIG. 5B is a plan view illustrating a heat dissipation member 550 of an electronic device according to an embodiment of the disclosure.

Referring to FIG. 5A, an electronic device (e.g., an electronic device 101 in FIGS. 1 and 2, the electronic device 300 in FIGS. 3A to 3C, or the electronic device 402 in FIG. 4) may include a substrate 501, a heating source 502, and a support member 510. On the substrate 501, electrical components of the electronic device including the heating source 502 are placed, and the substrate 501 is able to electrically connect individual components to each other. In another embodiment, the substrate 501 in FIG. 5A may be the same as the printed circuit board 324 in FIG. 3C. In FIG. 5A and subsequent drawings and the description of the disclosure, the direction of the surface on which components are bonded on the substrate unit 500 may be defined as a "top surface", a "top portion", or an "upper side". In addition, a direction perpendicular to the direction defined as the "upper side" may be defined as a "side surface", a "side portion", or a "lateral side".

The heating source 502 may, for example, be a component of an electrical circuit, such as a CPU (e.g., the processor 120 in FIG. 1), a graphics processing unit (GPU), a neural processing unit (NPU), an application processor (AP), a communication processor (CP), a radio frequency IC (RFIC), a power amplifier module (PAM), a DRAM, a flash memory, a power management IC (PMIC), or the like, and may generate heat during operation.

The heating source 502 may be a silicon chip in which an integrated circuit is provided. In an embodiment, the heating source 502 may have a planar polyhedron shape and may be, for example, a hexahedral IC package having a planar quadrangular shape. The IC package may be one in which at least one silicon chip and an electrical connection member, such as a bonding wire, are fixed with a material such as polymer or ceramic. In an embodiment, at least one of the surfaces of the heating source 502 (e.g., the top surface of the heating source 502) may be defined as a heat dissipation surface 502a, which dissipates heat generated from the heating source 502 to the outside. In some embodiments, an auxiliary thermal interface material 560 may be placed on the top surface of the heating source 502 as needed. The auxiliary thermal interface material 560 will be described later.

The support member 510 may be located on the substrate at the periphery of the heating source 502 to support the thermal interface material 540 when the thermal interface material 540 and the heat dissipation member 550, which will be described later, are bonded to the heating source 502. In an embodiment, the support member 510 may be a shield member that protects the heating source 502 from external electromagnetic interference (EMI) or blocks EMI generated from the heating source 502. The shield member may be, for example, a heat spreader or a shield can. In another embodiment, the support member may include a metal material such as stainless steel (SUS) in order to secure structural strength and EMI shielding ability. In some embodiments, the shield member may include an open-type shield can including an opening 512 so that a portion facing the heat dissipation surface 502a is opened while shielding the side portion of the heating source 502 on the substrate 501.

Referring to FIG. 5B, the heat dissipation member 550 may have a planar shape corresponding to the substrate unit 500 to be coupled to a top portion of the substrate unit 500. In some embodiments, the area of the heat dissipation member 550 may be substantially the same as that of the substrate unit 500. In an embodiment, the heat dissipation member 550 may be a heat sink for absorbing and diffusing heat generated by an electrical component on the substrate unit 500 including the heating source 502 and dissipating the heat to the outside of the electronic device. In other embodiments, the heat dissipation member 550 may include a ventilation portion provided to increase a heat dissipation area and to allow cooling air to pass through the space between the heat dissipation member 550 and the substrate 501. The ventilation portion may be provided in an edge area of the heat dissipation member 550. In some embodiments, the heat dissipation member 550 may include fastening holes 551 to be fastened onto the substrate 501.

In various embodiments, an insulating member 553 may be placed on a surface of the heat dissipation member 550 facing the substrate 501. The insulating member 553 may include a highly insulating material such as synthetic resin or rubber. The insulating member 553 may prevent an electrical component of a board unit 500 from malfunctioning or being failed due to energization or short circuit by the heat dissipation member containing a metal material. In another embodiment, the insulating member 553 may be bonded on the heat dissipation member 550 preferably in an area other than an area to which the thermal interface material 540 is bonded. Since the material of the insulating member 553 has low thermal conductivity, heat conduction from the heating source may not be hindered only when the insulating member is not placed between the heating source 502 and the heat dissipation member 550.

In still another embodiment, the thermal interface material 540 may be placed on a portion of the heat dissipation member 550 facing the heating source 502. The thermal interface material 540 may be bonded to the surface of the heat dissipation member 550 via an adhesive member 530. The thermal interface material 540 and the adhesive member 530 will be described later.

Figure 6A:
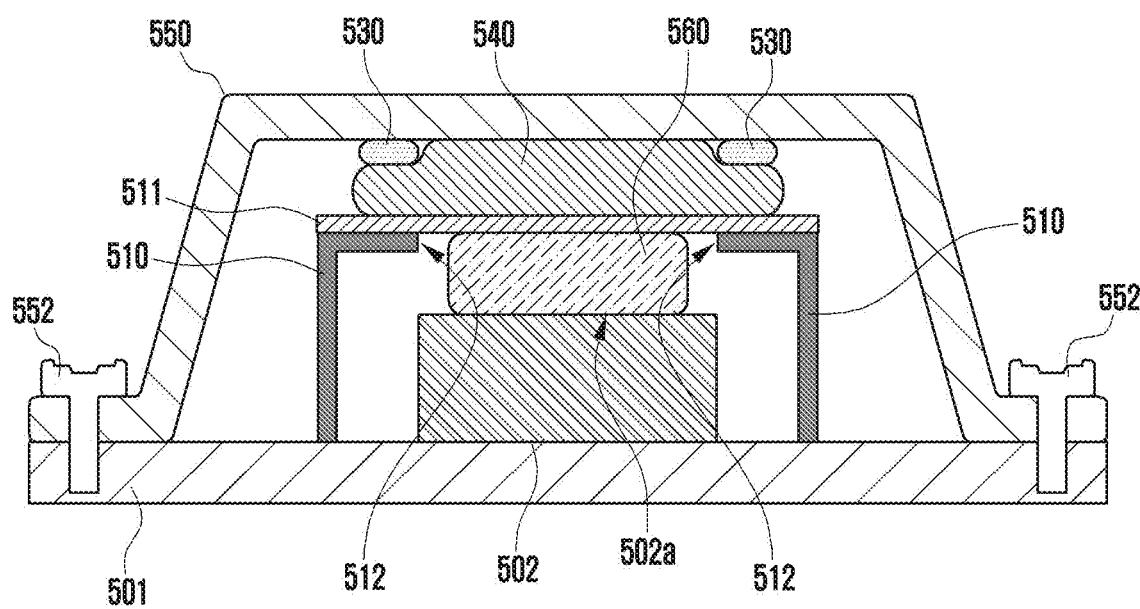
FIG. 6A is a cross-sectional view illustrating a heat dissipation structure of an electronic device according to an embodiment of the disclosure.

FIG. 6A is a cross-sectional view illustrating a heat dissipation structure of an electronic device according to an embodiment of the disclosure.

Figure 6B:
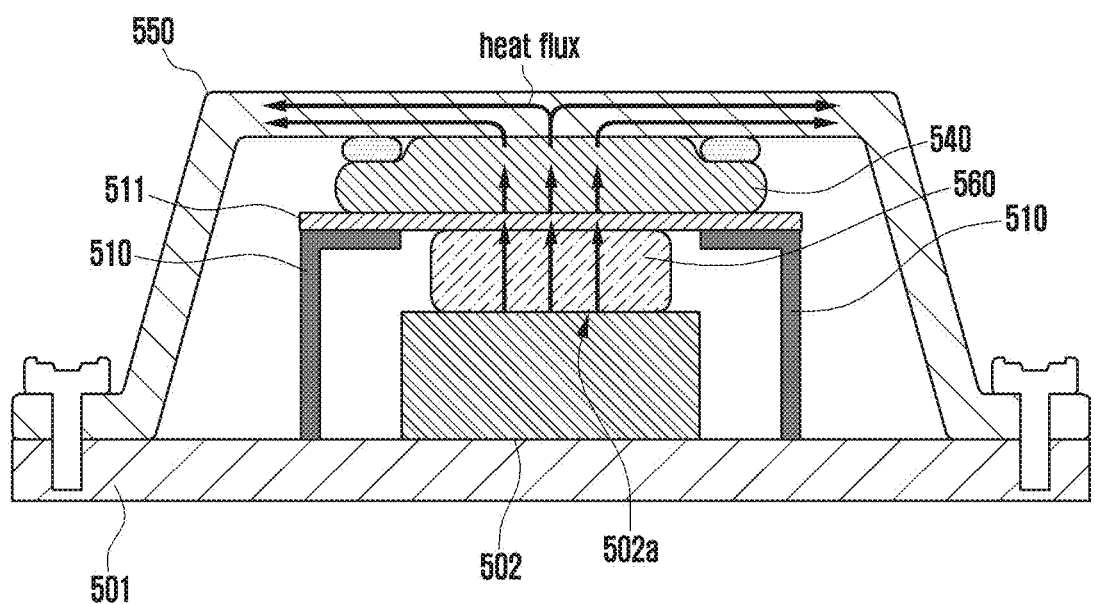
FIG. 6B is a cross-sectional view illustrating heat flow during operation of a heat dissipation structure of the electronic device according to an embodiment of the disclosure.

FIG. 6B is a cross-sectional view illustrating heat flow during operation of a heat dissipation structure of an electronic device according to an embodiment of the disclosure.

FIGS. 6A and 6B illustrate a cross section taken along line A-A' in FIGS. 5A and 5B. The arrows in FIG. 6B indicate the flow of heat.

Referring to FIG. 6A, the heat dissipation structure of the electronic device may include a support member 510, a thermal interface material 540, an adhesive member 530, and a heat dissipation member 550.

The support member 510 may be located on a lateral side of the heating source 502 placed on the substrate 501 and may support the heat dissipation member 550 and the thermal interface material 540, which are placed above the heating source 502. The support member 510 may, for example, support an area where the adhesive member 530 is attached under the bottom surface of the thermal interface material 540 such that the thermal interface material 540 may be brought into close contact with the heat dissipation member 550. In some embodiments, the support member 510 may be a heat spreader of an IC package, but in other embodiments, the support member 510 may be an open-type shield can in which a portion facing the heat dissipation surface 502a of the support member 510 is open.

The thermal interface material 540 may be placed on the lower surface of the heat dissipation member 550 above the heat dissipation surface 502a to face the heat dissipation surface 502a, may be supported by the support member 510, and may transfer heat generated from the heating source 502 to the heat dissipation member 550. In another embodiment, the thermal interface material 540 fills a gap between the heating source 502 and the heat dissipation member 550 caused by tolerances during assembly of the heat dissipation member 550 and/or roughness of the surface of the heat dissipation member 550 and comes into close contact with the heat dissipation member 550 so that the overall thermal resistance of the heat dissipation structure may be reduced. In some embodiments, the thermal interface material 540 may be a thermal pad preformed in a plate shape to be easily applied when assembling the electronic device.

In various embodiments, the thermal interface material 540 may include carbon-containing heat conductive fibers, such as carbon fibers, graphene fibers, or carbon nanotube fibers. The carbon-containing heat conductive fibers, which have high thermal conductivity in a specific direction while being flexible, may be suitable as the thermal interface material 540. In other embodiments, the thermal interface material 540 may include a woven fabric of the above-mentioned carbon-containing heat conductive fiber.

In some embodiments, the thermal interface material 540 may include a binder for binding the above-mentioned carbon-containing heat conductive fiber. Since the heat conductive fibers are not mutually bonded by themselves, the heat conductive fibers may be impregnated with the binder such that the heat conductive fibers may be bonded to each other and the aligned state of the carbon fibers may be maintained. The binder may include an elastomer such as silicone resin, NBR, or polyurethane resin and/or a wax material such as paraffin. The thermal interface material 540, which has elasticity and spreadability by being made of the elastomer and/or wax material, may be suitable for filling the gap between the heat dissipation member 550 and the heating source 502. Additionally, when compressive stress is applied, the thermal interface material 540 may be compressively deformed, or material flow may occur in a lateral direction relative to the compressively deformed direction. The above-mentioned material flow may bring the thermal interface material 540 into close contact with the heat dissipation member 550.

The adhesive member 530 may be bonded to the top surface of the thermal interface material 540 and the bottom surface of the heat dissipation member 550 to fix the thermal interface material 540 to the heat dissipation member 550. In some embodiments, the adhesive member 530 may include a double-sided tape having adhesive applied to two opposite surfaces thereof. In an embodiment, the thermal interface material 540 may have low bondability to the heat dissipation member 550 depending on the composition of the above-described binder. However, in the disclosure, since the adhesive member 530 is used, it is possible to prevent the thermal interface material 540 from being detached from the heat dissipation member 550 in the assembly process of the electronic device. In another embodiment, the adhesive member 530 may be placed on a portion of the thermal interface material 540 supported by the support member 510.

In yet another embodiment, the heat dissipation member 550 may act as a heat sink that finally dissipates, to the outside of the electronic device, heat transferred thereto from the heating source 502 via the thermal interface material 540. In some embodiments, the heat dissipation member 550 may include a metal material having high thermal conductivity, such as aluminum or copper. In still another embodiment, the heat dissipation member 550 may include a heat pipe or a vapor chamber, which evaporates, by the heat of the heating source 502, a fluid, such as water, supplied from a low-temperature portion by a capillary action of a fine structure, such as a wick, and releases the heat of the heating source 502 by moving latent heat included in the evaporated fluid to the low-temperature portion. In some embodiments, the heat dissipation member 550 may be coupled to the substrate 501 by fastening members 552 such as screws or rivets, or snap-fitted.

A shield film 511 may be placed above the support member 510 and below the thermal interface material 540. When the support member 510 is an open-type shield can, the shield film 511 may improve EMI shielding performance by shielding the open area of the support member 510.

An auxiliary thermal interface material 560 may be placed on the heat dissipation surface 502a. The auxiliary thermal interface material 560 may be a thermal interface material (TIM) that fills the space between the heat dissipation surface 502a of the heating source 502 and the support member 510 or the shield film 511 to reduce thermal resistance. The auxiliary thermal interface material 560 may include a liquid phase or a slurry phase that is easily applicable by application in order to simplify the process. In an example, the auxiliary thermal interface material 560 may be a thermal paste containing a silicone resin or a metallic TIM containing a liquid metal. In some embodiments, the auxiliary thermal interface material is in a liquid or slurry state when initially applied, and may be dried, solidified, or cured as assembly of the electronic device is completed.

The auxiliary thermal interface material 560 may, for example, be injected and applied through the opening 512 in the support member 510 when assembling the electronic device, and after the shield film 511 is assembled to the top portion of the opening 512, the thermal interface material 540 and the heat dissipation member 550 may be assembled. Since the auxiliary thermal interface material 560 is suitable for application on the heating surface 502a and the thermal interface material 540 is suitable for bonding on the surface of the heat dissipation member 550, thermal interface materials having different properties may be used for respective processes.

Referring to FIG. 6B, in the heat flow of the heat dissipation structure of the electronic device according to embodiments of the disclosure, the heat generated from the heating source 502 is transferred from the heat dissipation surface 502a, the heat is transferred to a portion of the thermal interface material 540 facing the heat dissipation surface 502a, and the thermal interface material 540 transfers the heat to a portion of the heat dissipation member 550 facing the heat dissipation surface 502a. In an embodiment, the heat transferred to the heat dissipation member 550 may be transferred to the lateral side and released to the outside of the electronic device. The portions through which heat flow passes in the series of heat transfer processes described above may be defined as a heat transfer path.

Referring to FIG. 6B, the support member 510 may support the thermal interface material 540 outside the heat transfer path, and the adhesive member 530 may be placed on a portion of the thermal interface material 540 supported by the support member 510. Due to the configuration described above, the adhesive member 530 may bond the thermal interface material 540 to the heat dissipation member 550 in the state of being placed outside the heat transfer path. Since the adhesive member 530 has high thermal resistance, when the thermal interface material 540 is bonded to the heat dissipation member 550 by the adhesive member 530, the thermal resistance may increase, and the heat dissipation capability may decrease. Since the adhesive member 530 is not placed on the heat transfer path, an increase in thermal resistance may be prevented.

Figure 7A:
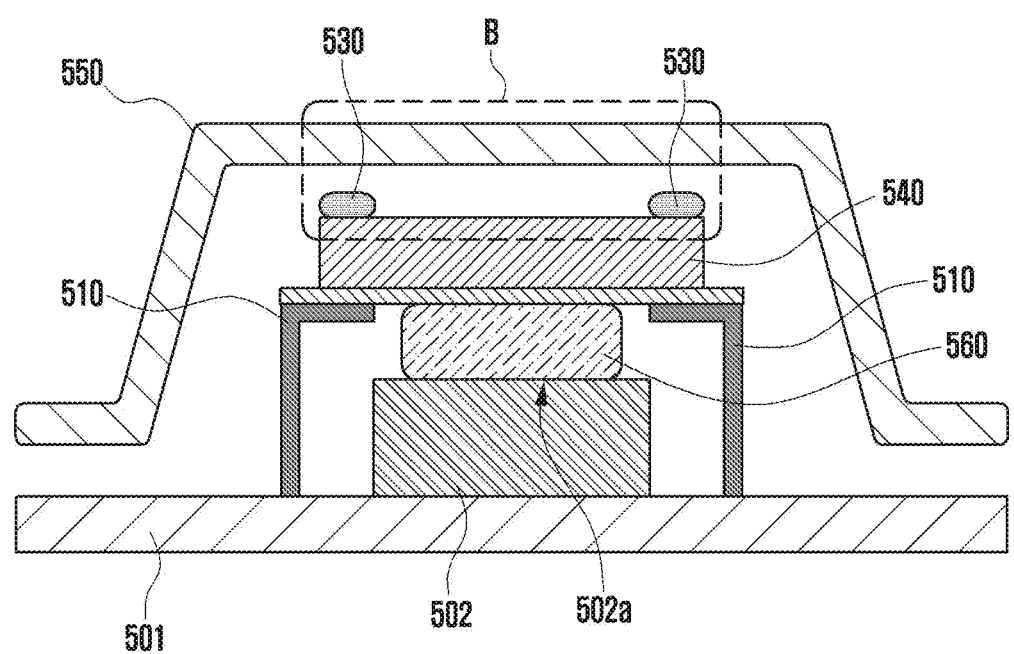
FIG. 7A is a cross-sectional view illustrating an assembly process of a heat dissipation structure of an electronic device according to an embodiment of the disclosure.

FIG. 7A is a cross-sectional view illustrating an assembly process of a heat dissipation structure of an electronic device according to an embodiment of the disclosure.

Figure 7B:
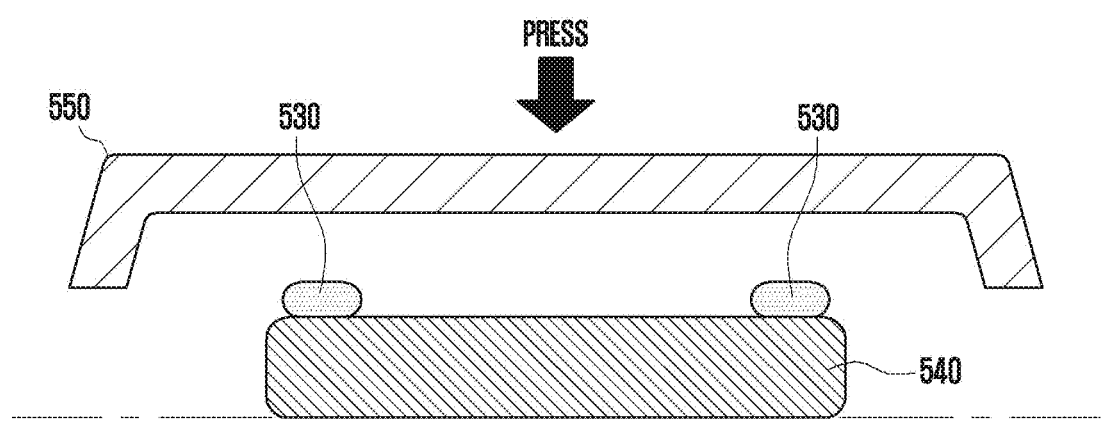
FIG. 7B is an enlarged cross-sectional view illustrating an assembly process of a heat dissipation structure of an electronic device according to an embodiment of the disclosure.

FIG. 7B is an enlarged cross-sectional view illustrating an assembly process of a heat dissipation structure of an electronic device according to an embodiment of the disclosure.

Figure 7C:
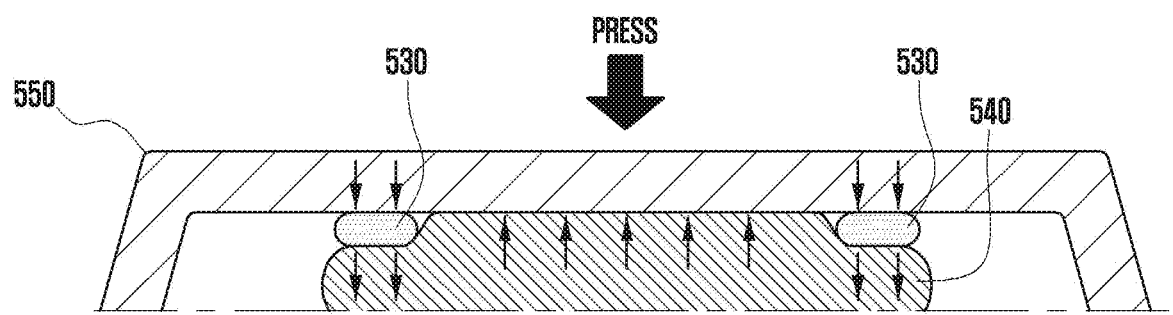
FIG. 7C is an enlarged cross-sectional view illustrating an action of a thermal interface material which is brought into close contact with a heat dissipation member in an assembly process of a heat dissipation structure of an electronic device according to an embodiment of the disclosure.

FIG. 7C is an enlarged cross-sectional view illustrating an action of a thermal interface material 540 which is brought into close contact with a heat dissipation member 550 in an assembly process of a heat dissipation structure of an electronic device according to an embodiment of the disclosure.

Figure 7D:
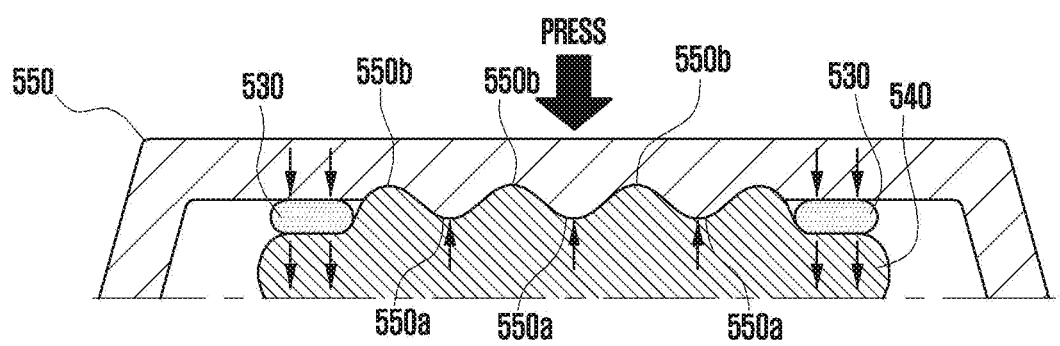
FIG. 7D is an enlarged cross-sectional view illustrating a concavo-convex structure of a heat dissipation member according to an embodiment of the disclosure.

FIG. 7D is an enlarged cross-sectional view illustrating a concavo-convex structure of a heat dissipation member 550 according to an embodiment of the disclosure.

Figure 7E:
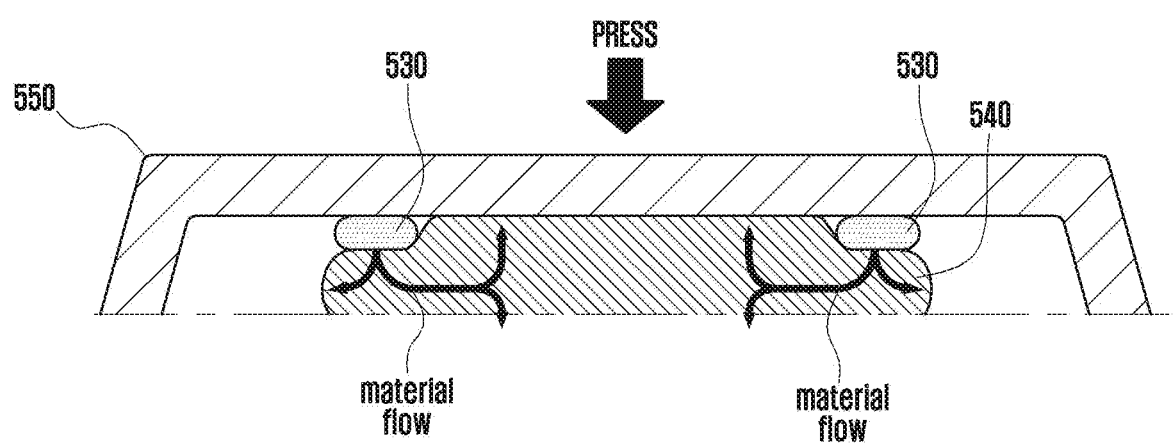
FIG. 7E is an enlarged cross-sectional view illustrating material flow of a thermal interface material in an assembly process of a heat dissipation structure of an electronic device according to an embodiment of the disclosure.

FIG. 7E is an enlarged cross-sectional view illustrating material flow of a thermal interface material 540 in an assembly process of a heat dissipation structure of an electronic device according to an embodiment of the disclosure.

The arrows in FIG. 7E indicate the material flow of the thermal interface material 540.

Referring to FIGS. 7A and 7B, in the process of assembling the electronic device, the heat dissipation member 550 may be covered on the top portion of the thermal interface material 540 to press the adhesive member 530 and the thermal interface material 540. In an embodiment, the thermal interface material 540 may maintain a flat plate shape as a whole before being pressed by the heat dissipation member 550, and the adhesive member 530 may be placed on the top portion of the thermal interface material 540.

Referring to FIG. 7C, the heat dissipation member 550 presses the adhesive member 530 on the thermal interface material 540, and the thermal interface material 540 may be pressed by the adhesive member 530. In another embodiment, the thermal interface material 540, which has elasticity and spreadability, may be compressively deformed by the pressure of the adhesive member 530. A portion of the thermal interface material 540 on the heat transfer path, where the adhesive member 530 is not placed, is not compressively deformed, thereby being brought into close contact with the bottom surface of the heat dissipation member 550. In order for the thermal interface material 540 to be compressively deformed by the pressure of the adhesive member 530, it may be desirable for the thermal interface material 540 to have lower compressive stiffness than the adhesive member 530.

Referring to FIG. 7D, the heat dissipation member 550 may include a concavo-convex structure formed on the bottom surface to which a thermal interface material is bonded. The concavo-convex structure may, for example, include concave portions 550a and/or convex portions 550b. When assembling the heat dissipation member 550, the concave portions 550a and the convex portions 550b may assist in compressive deformation of the thermal interface material, thereby assisting close contact between the thermal interface material and the bottom surface of the heat dissipation member 550. The concavo-convex structure may be formed through machining, stamping, or press shaping.

Referring to FIG. 7E, in some embodiments, material flow due to compressive deformation may occur in a portion of the thermal interface material 540 that is compressively deformed by being pressed by the adhesive member 530. Since the portion of the thermal interface material 540 to which the adhesive member 530 is bonded is supported by the support member 510, the material flow is directed to a lateral side relative to the compressively deformed direction. A portion of the thermal interface material 540 located on the heat transfer path, to which the adhesive member 530 is not attached, may be expanded by the above-described material flow. Due to the expansion of the thermal interface material 540, the thermal interface material 540 may be more effectively brought into close contact with the bottom surface of the heat dissipation member 550. Additionally, the expansion of the thermal interface material 540 may also improve close contact property between components located under the thermal interface material, such as the support member 510, the shield film 511, the auxiliary thermal interface material 560, and/or the heating source 502.

An increase in thermal resistance between the heating source 502, such as an AP of the electronic device, and the heat dissipation member 550 may be due to the generation of a gap between the heat dissipation member 550 and the heating source 502, and it is necessary to fill the gap with the thermal interface material 540 to reduce thermal resistance. Accordingly, it is possible to reduce thermal resistance of the heat dissipation structure of the electronic device by bringing the thermal interface material 540 into close contact with the heat dissipation member 550 to prevent occurrence of a gap between the thermal interface material 540 and the heat dissipation member 550.

FIGS. 8A to 8D are plan views illustrating the arrangements of adhesive members 530 according to various embodiments of the disclosure.

Referring to FIGS. 8A to 8D, the heating source 502, such as an AP of an electronic device, may have a polygonal planar chip shape, and the support member 510 may surround the heating source 502 in a polygonal (e.g., quadrangular) shape. In an embodiment, the thermal interface material 540 is placed on the top portion of the heating member so as to be supported by the support member 510 at the side of the polygon, and may have a polygonal shape corresponding to the shape of the support member 510. Adhesive members 530 may be placed on a periphery of the thermal interface material 540 along one or more sides of the thermal interface material 540.

Figure 8A:
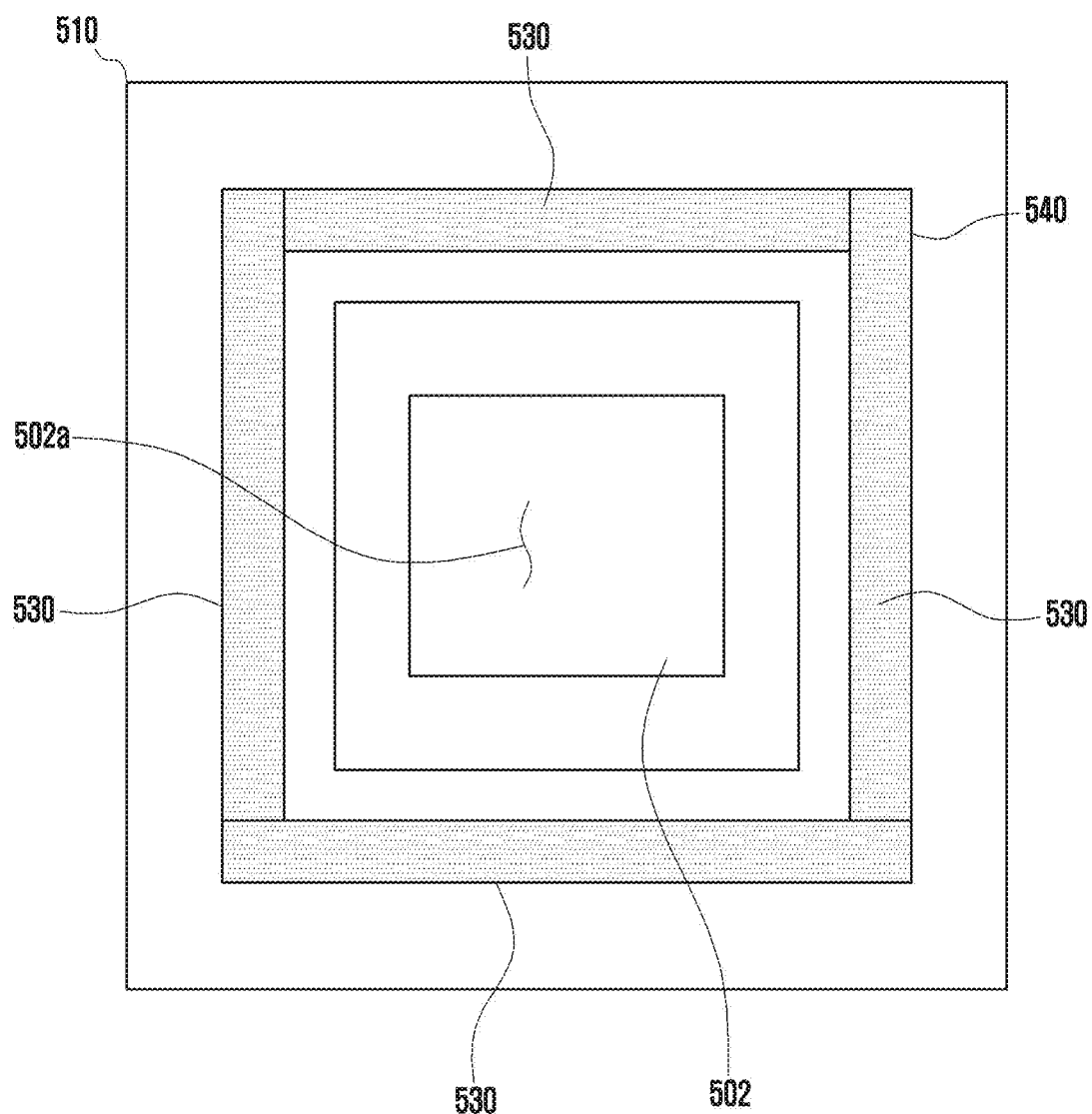
FIGS. 8A, 8B, 8C, and 8D are plan views illustrating arrangements of adhesive members according to various embodiments of the disclosure.

Referring to FIG. 8A, adhesive members 530 may, for example, be arranged along the periphery of the thermal interface material 540, on all the sides of the periphery of the thermal interface material 540. The arrangement illustrated in FIG. 8A corresponds to an embodiment in which the bonding force between the thermal interface material 540 and the heat dissipation member 550 is the highest while heat transfer is not hindered by the adhesive members 530.

Figure 8B:
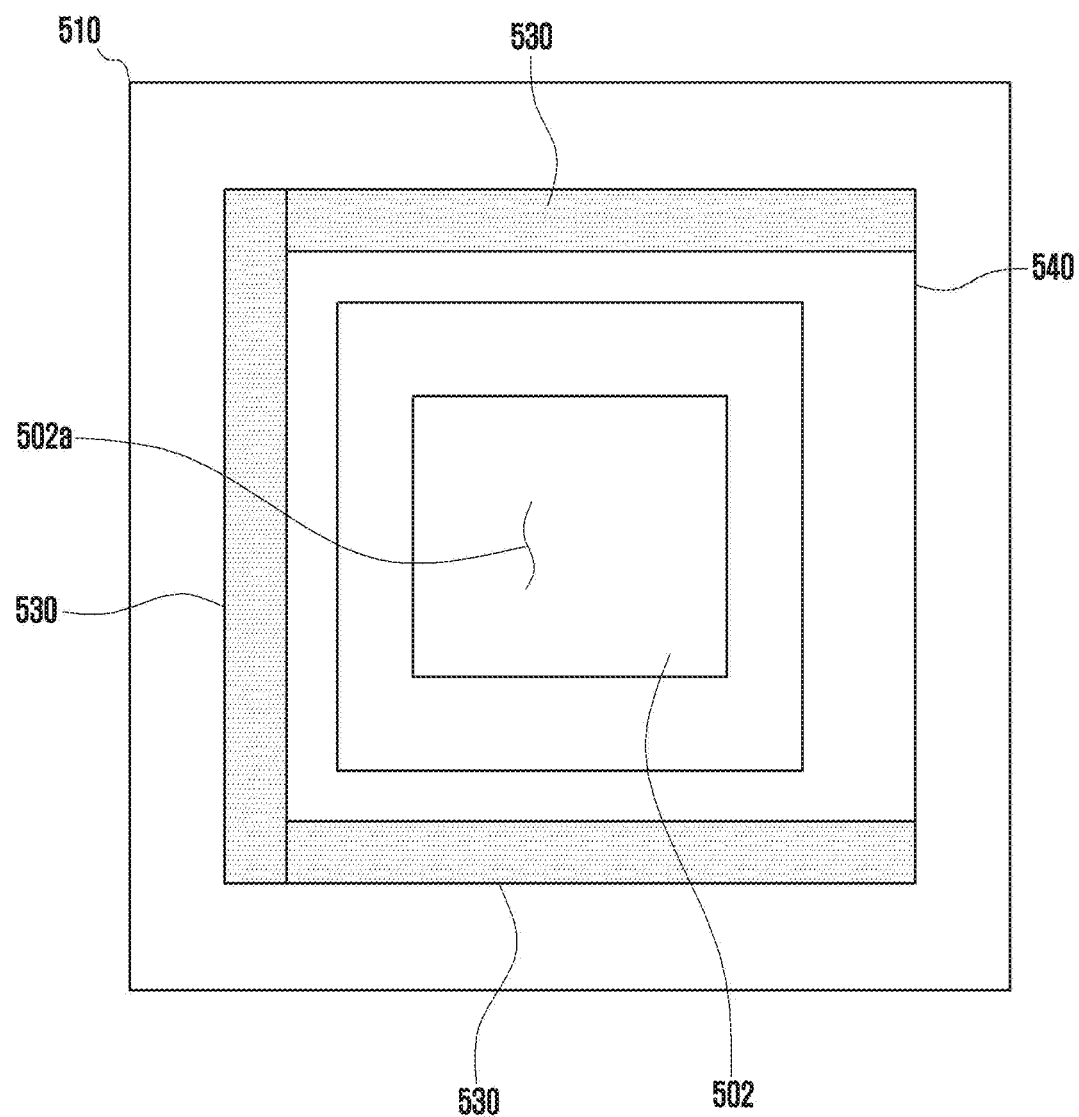

Referring to FIG. 8B, the adhesive members 530 may, for example, be arranged on the sides of the periphery of the thermal interface material 540 except for one side of the periphery. When the adhesive member 530 is not arranged on one side, air trapped in the gap between the thermal interface material 540 and the heat dissipation member 550 may be easily escaped. Accordingly, close contact property between the thermal interface material 540 and the heat dissipation member 550 may be improved.

Figure 8C:
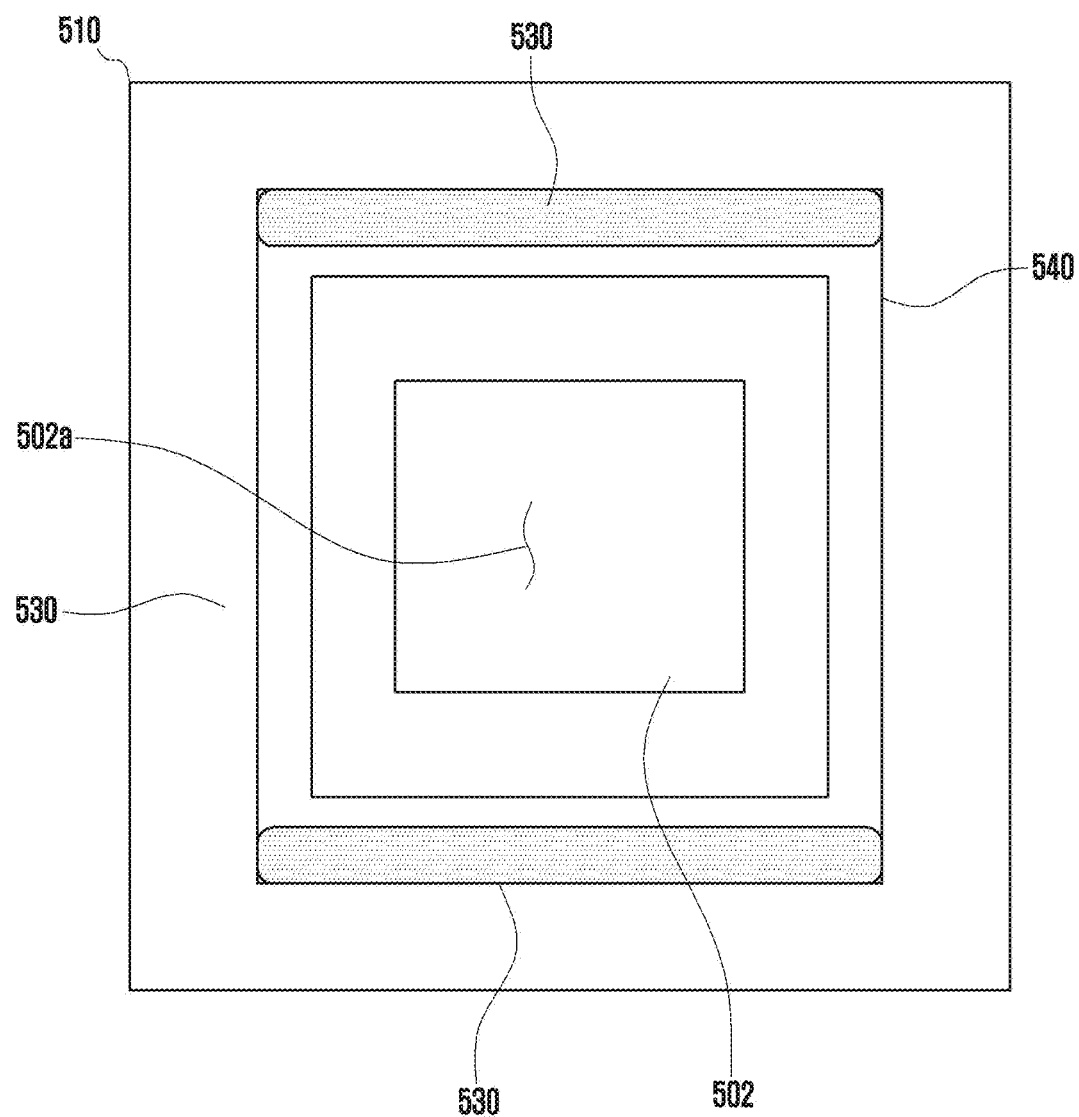

Referring to FIG. 8C, adhesive members 530 may be arranged on two facing sides of the periphery of the thermal interface material 540. In this arrangement, it is easy for air trapped in the gap to escape in the direction where the adhesive members 530 are not placed, so that the close contact property between the thermal interface material 540 and the heat dissipation member 550 may be improved, and the force of pressing the thermal interface material 540 may be distributed in a balanced manner.

Figure 8D:
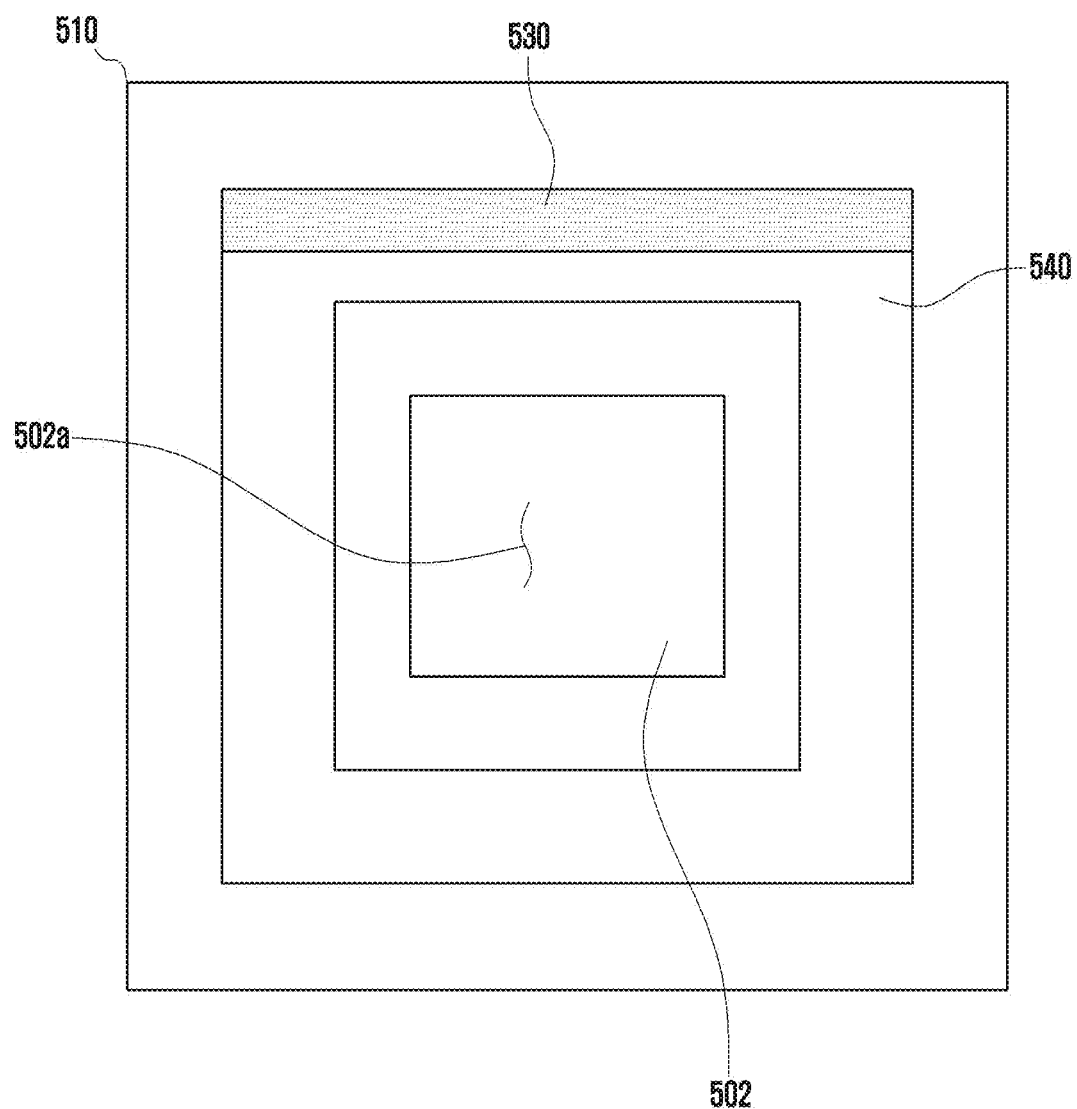

Referring to FIG. 8D, an adhesive member 530 may be disposed on one side of the periphery of the thermal interface material 540. When the adhesive member 530 is arranged as illustrated in FIG. 8D, when the thermal interface material 540 is pressed by the adhesive member 530, the material flow of the thermal interface material 540 uniformly is able to occur in one direction so that formation of a gap between the heat dissipation member 550 and the thermal interface material 540 may be minimized.

Through an experiment, cooling performances of an electronic device having a heat transfer structure according to an embodiment of the disclosure and an electronic device according to a comparative example were compared. The electronic device according to the comparative example was an electronic device in which the double-sided tape was applied to the entire area of the thermal interface material 540 including a heat dissipation path. In the experiment, with respect to each electronic device, a benchmark software that increases the power consumption of an AP, which is the heating source 502, was driven in the same way, and then the heating pattern and the temperature of the AP due to the power consumption of the AP were identified. Experimental results are illustrated in FIGS. 9 and 10.

Figure 9:
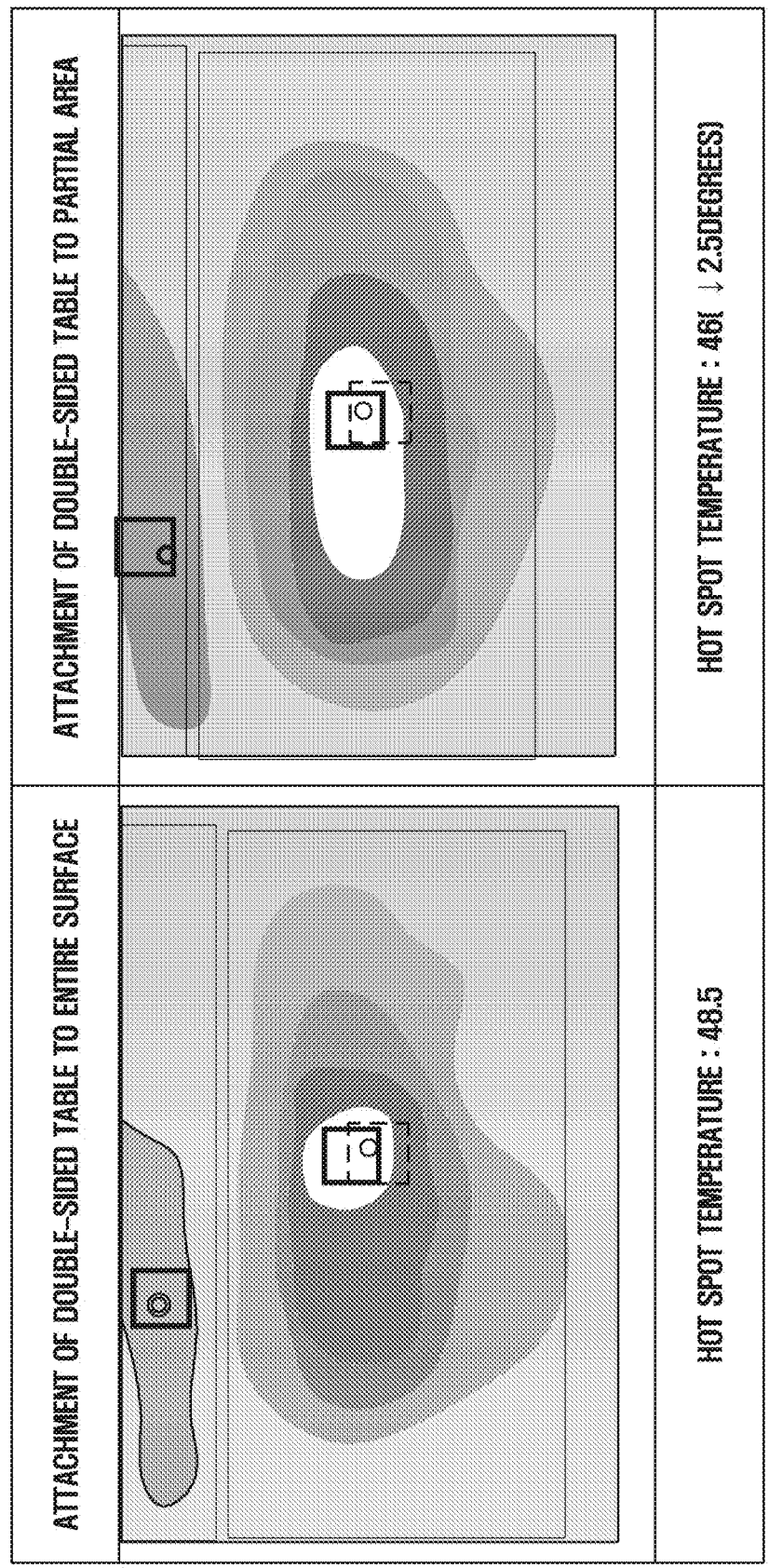
FIG. 9 illustrates photographs of heating patterns of an electronic device and a comparative example taken by a thermal imaging camera according to an embodiment of the disclosure.

FIG. 9 illustrates photographs of heating patterns of an electronic device and the comparative example taken by a thermal imaging camera according to an embodiment of the disclosure.

Figure 10:
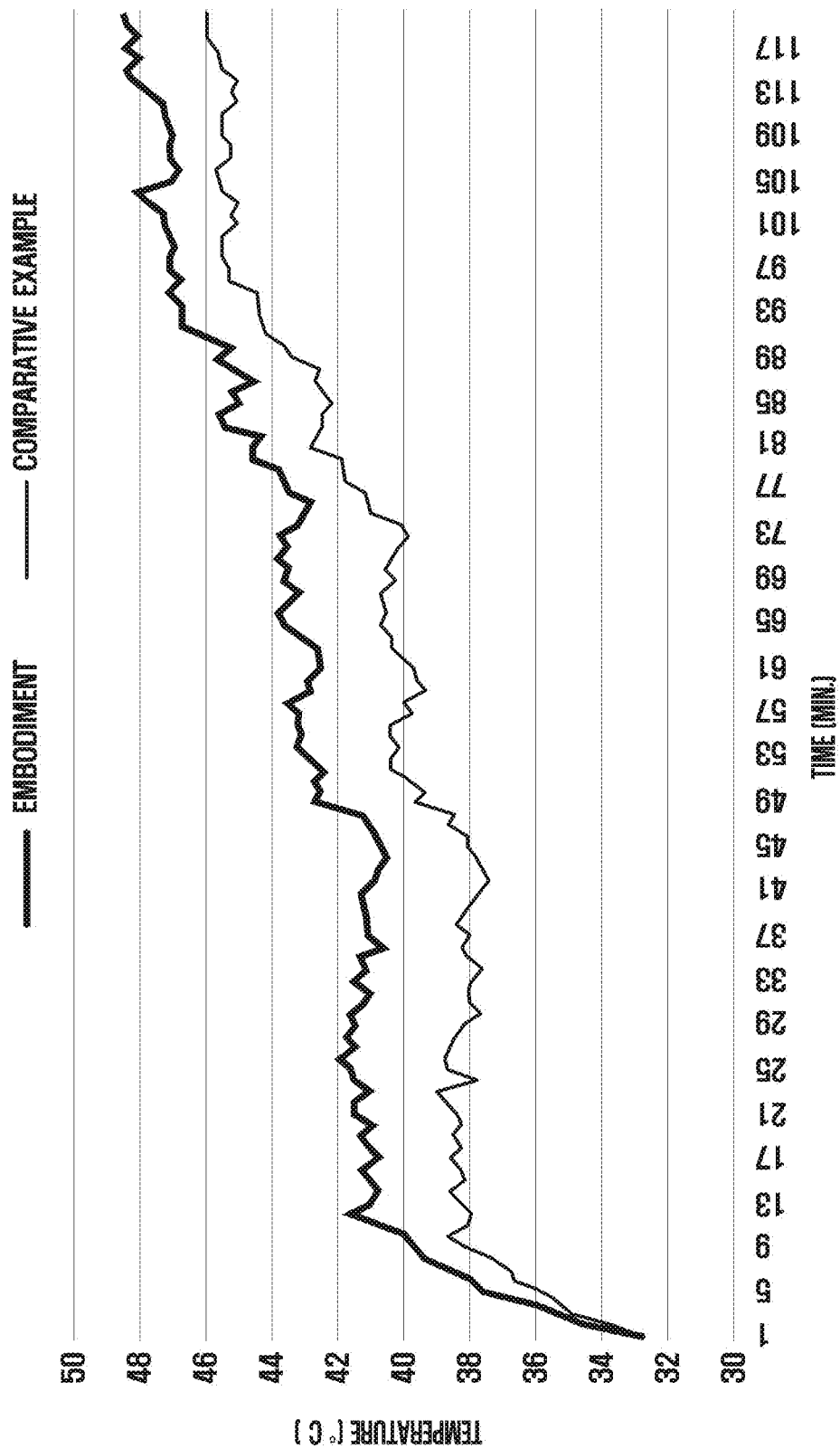
FIG. 10 is a graph showing temperature changes over time of electronic devices and a comparative example according to an embodiment of the disclosure.

FIG. 10 is a graph showing temperature changes over time of electronic devices and the comparative example according to an embodiment of the disclosure.

Referring to FIG. 9, the areas marked in white are areas with the highest temperature in the thermal imaging camera, and black and gray areas indicate cooler areas as brightness increases. The rectangles indicate the areas where the temperature was measured.

Referring to FIG. 9, it can be seen that the temperature of the hot spot of the electronic device according to the embodiment of the disclosure illustrated in (b) of FIG. 9 is lower than that in the comparative example illustrated in (a) of FIG. 9 by 2.5 degrees C. and the high-temperature area in the embodiment of the disclosure is wider than that in the comparative example. From the fact that the high-temperature area is relatively widely spread, it can be seen that heat is smoothly transferred from the AP, which is the heating source 502 of the electronic device, through the heat dissipation member 550.

Referring to FIG. 10, it can be seen that, when the calorific values were increased by driving the benchmark software in the electronic devices according to the embodiment and the comparative example of the disclosure, the temperatures of both electronic devices rapidly increased initially, but the temperature of the electronic device according to the embodiment of the disclosure is stabilized at a temperature lower than that of the comparative example by 2 to 2.5 degrees C. In addition, it can be seen that the temperature difference of 2 to 2.5 degrees Celsius is maintained even though the benchmark program was continuously operated for 2 hours thereafter, and through this, it can be seen that the embodiment of the disclosure is able to more effectively transfer heat from the heating source 502 than the comparative example even at a lower temperature gradient.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a heating source comprising a heat dissipation surface configured to dissipate heat;
a support member disposed on a lateral side of the heat dissipation surface and surrounding at least a portion of the heating source;
a heat dissipation member facing the heat dissipation surface of the heating source and disposed to cover an area in which the support member is disposed;
a thermal interface material disposed between the heat dissipation surface of the heating source and the bottom surface of the heat dissipation member; and
an adhesive member disposed in the area in which the thermal interface material is supported by the support member between the thermal interface material and the heat dissipation member,
wherein the adhesive member bonds the thermal interface material and the heat dissipation member to each other,
wherein the adhesive member presses an area of the heat dissipation member in which the thermal interface material is supported by the support member, and
wherein the thermal interface material is compressively deformed in the area in which the adhesive member is disposed to come into close contact with an area of the heat dissipation member facing the heat dissipation surface.

2. The electronic device of claim 1, wherein the thermal interface material comprises a carbon-containing heat conductive fiber.

3. The electronic device of claim 1,
wherein the thermal interface material has a lower compressive stiffness than that of the adhesive member, and
wherein, in case that the heat dissipation member is bonded to a top portion of the thermal interface material, the thermal interface material is compressively deformed in the area pressed by the adhesive member, and expansion occurs in the thermal interface material due to the compressive deformation, so that the thermal interface material is brought into close contact with a bottom surface of the heat dissipation member.

4. The electronic device of claim 1,
wherein the support member is an open-type shield can, which is open in an area facing the heat dissipation surface,
wherein the support member is configured to shield a top and side surfaces of a heating element from electromagnetic noise, and
wherein the electronic device further comprises:
a shield film disposed above the open area of the open-type shield can, and
an auxiliary thermal interface material placed between the heat dissipation surface of the heating source and the bottom surface of the shield member.

5. The electronic device of claim 1,
wherein the support member is disposed in a polygonal shape surrounding four side surfaces of the heat dissipation surface,
wherein the thermal interface material has a polygonal shape corresponding to the shape of the support member, and
wherein the adhesive member is disposed on at least one side of the polygonal shape of the thermal interface material supported by the support member.

6. The electronic device of claim 5, wherein the adhesive member is disposed on sides of the polygonal shape of the thermal interface material except for one side of the polygonal shape.

7. The electronic device of claim 5, wherein the adhesive member is disposed on two facing sides of the polygonal shape of the thermal interface material.

8. A heat dissipation device for an electronic device comprising a heating source having a heat dissipation surface, the heat dissipation device comprising:
a support member disposed on a side of the heat dissipation surface and surrounding at least a portion of the heating source;
a heat dissipation member facing the heat dissipation surface of the heating source and disposed to cover an area in which the support member is disposed;
a thermal interface material disposed between the heat dissipation surface of the heating source and the bottom surface of the heat dissipation member, and supported by the support member; and
an adhesive member disposed in the area in which the thermal interface material is supported by the support member between the thermal interface material and the heat dissipation member,
wherein the adhesive member bonds the thermal interface material and the heat dissipation member to each other,
wherein the adhesive member presses an area of the heat dissipation member in which the thermal interface material is supported by the support member, and
wherein the thermal interface material is compressively deformed in the area in which the adhesive member is disposed to come into close contact with an area of the heat dissipation member facing the heat dissipation surface.

9. The heat dissipation device of claim 8, wherein the thermal interface material comprises a carbon-containing heat conductive fiber.

10. The heat dissipation device of claim 8,
wherein the thermal interface material has a lower compressive stiffness than that of the adhesive member, and
wherein, in case that the heat dissipation member is bonded to a top portion of the thermal interface material, the thermal interface material is compressively deformed in the area pressed by the adhesive member, and expansion occurs in the thermal interface material due to the compressive deformation, so that the thermal interface material is brought into close contact with a bottom surface of the heat dissipation member.

11. The heat dissipation device of claim 8, wherein the support member is a shield member configured to shield the top and side surfaces of a heating element from electromagnetic noise.

12. The heat dissipation device of claim 11,
wherein the shield member is an open-type shield can in which an area facing the heat dissipation surface is open and is configured to shield the side surface of the heating element, and
wherein the heat dissipation device further comprises:
a shield film disposed above the open area of the open-type shield can, and
an auxiliary thermal interface material placed between the heat dissipation surface of the heating source and the bottom surface of the shield member.

13. The heat dissipation device of claim 8,
wherein the support member is disposed in a polygonal shape surrounding four side surfaces of the heat dissipation surface,
wherein the thermal interface material has a polygonal shape corresponding to the shape of the support member, and
wherein the adhesive member is disposed on at least one side of the polygonal shape of the thermal interface material supported by the support member.

14. The heat dissipation device of claim 13, wherein the adhesive member is disposed on sides of the polygonal shape of the thermal interface material except for one side of the polygonal shape.

15. The heat dissipation device of claim 13, wherein the adhesive member is disposed on two facing sides of the polygonal shape of the thermal interface material.

\* \* \* \* \*